United States Patent
Ide et al.

(10) Patent No.: US 7,750,712 B2
(45) Date of Patent: Jul. 6, 2010

(54) TIMING CONTROL CIRCUIT, TIMING GENERATION SYSTEM, TIMING CONTROL METHOD AND SEMICONDUCTOR MEMORY DEVICE

(75) Inventors: Akira Ide, Tokyo (JP); Yasuhiro Takai, Tokyo (JP); Akira Kotabe, Hino (JP); Tomonori Sekiguchi, Tama (JP); Riichiro Takemura, Los Angels, CA (US); Satoru Akiyama, Kokubunji (JP)

(73) Assignee: Elpida Memory, Inc., Tokyo (JP)

( * ) Notice: Subject to any disclaimer, the term of this patent is extended or adjusted under 35 U.S.C. 154(b) by 80 days.

(21) Appl. No.: 12/314,207

(22) Filed: Dec. 5, 2008

(65) Prior Publication Data

US 2009/0146716 A1 Jun. 11, 2009

(30) Foreign Application Priority Data

Dec. 7, 2007 (JP) ............................. 2007-317161

(51) Int. Cl.
*H03H 11/26* (2006.01)
(52) U.S. Cl. .................. 327/276; 327/158; 327/159; 327/261
(58) Field of Classification Search .............. 327/276, 327/277, 291, 293, 295, 299, 158, 159, 161, 327/261, 269, 270
See application file for complete search history.

(56) References Cited

U.S. PATENT DOCUMENTS 7,388,415 B2 * 6/2008 Lee ............................ 327/158

2007/0279113 A1 * 12/2007 Maeda et al. ................ 327/158

FOREIGN PATENT DOCUMENTS

| JP | 2004-110490 | 4/2004 |
| JP | 2006-186547 | 7/2006 |

OTHER PUBLICATIONS

Gotoh, Kohtaroh et al., "All-Digital Multi-Phase Delay Locked Loop for Internal Timing Generation in Embedded and/or High-Speed DRAMs," 1997 Symposium on VLSI Circuits Digest of Technical Papers, pp. 107-108.

* cited by examiner

*Primary Examiner*—An T Luu
(74) *Attorney, Agent, or Firm*—McDermott Will & Emery LLP

(57) ABSTRACT

A timing control circuit DLY1 receives clock signal CKa with period T1 and activation signal ACT and outputs fine timing signal FT with delay of m*T1+tda measured from the clock signal where m denotes a non-negative integer and tda denotes delay in the analog delay element. The timing control circuit DLY1 comprises a coarse delay circuit CD and a fine delay circuit FD. The coarse delay circuit CD comprises a counter for counting a rising edge of the clock signal CKa after receiving activation signal ACT and outputs coarse timing signal CT with delay of m*T1 measured from a rising edge of the clock signal CKa. The fine delay circuit FD comprises a plurality of analog delay elements and outputs fine delay timing signal FT with delay of tda measured from the coarse timing signal CT. Variation in delay of timing signal is reduced.

19 Claims, 22 Drawing Sheets

Best

Worst

TIMING CONTROL CIRCUIT, TIMING GENERATION SYSTEM, TIMING CONTROL METHOD AND SEMICONDUCTOR MEMORY DEVICE

REFERENCE TO RELATED APPLICATION

This application is based upon and claims the benefit of the priority of Japanese patent application No. 2007-317161, filed on Dec. 7, 2007, the disclosure of which is incorporated herein in its entirety by reference thereto.

BACKGROUND OF THE INVENTION

1. Field of the Invention

The present invention relates to a timing control circuit, timing generation system, timing control method and a semiconductor memory device, and more specifically to a timing control circuit, timing generation system and timing generation method suitable for generating a timing signal for a semiconductor memory device and a semiconductor memory device which includes the timing control circuit.

2. Description of Related Art

FIG. 20A is a diagram schematically showing a typical structure of a logic LSI chip. With reference to FIG. 20A, in the logic LSI chip (LOGIC), to increase throughput of the data processing, a pipeline operation is used where a flip-flop circuit (FF) divides the path from data input (DIN) to data output (DOUT) into a plurality of logical circuit blocks (LGK) and the flip-flop circuits (FF1, FF2 and FF3) are controlled by a clock signal (CK). Since the logical circuit blocks (LGK) can be divided in the manner that each of them has nearly the same delay in the logic LSI chip (LOGIC), the operation frequency can be increased as described above by the pipeline operation based on the flip-flop circuits (FF1, FF2 and FF3) controlled by a common clock signal. In the pipeline operation, the flip-flop circuit (FF) samples an output signal from the logical circuit block (LGK) at the previous stage in synchronization with the clock signal and outputs the sampled value to the logical circuit block (LGK) at the next stage, where an operation in each stage of the logical circuit blocks (LGK) is performed within one clock cycle.

FIG. 20B is a diagram schematically illustrating a typical structure of a clock-synchronous-type synchronous DRAM (SDRAM). In FIG. 20B, for simplicity, a flip-flop circuit at the input stage for sampling each of command (CMD) and address (ADD) is denoted by FF1 and a decoder for decoding command and address is denoted by DEC. With reference to FIG. 20B, in the synchronous DRAM (SDRAM), the flip-flop circuits FF1 at the command and address input stage and FF4 at the data output stage are controlled by (a rising edge of) the clock signal CK, while the other flip-flop circuits (for example FF2 and FF3) in the chip are controlled by a timing control signal generated by an analog delay circuit (ADLY1, ADLY2) in the timing control circuit (TG) by delaying a pulse generated by a pulse generator (PG) from the clock signal (CK) input from the external terminal.

In a synchronous DRAM, a delay in each of functional blocks in the chip, a decoder (DEC), a memory array (MEMCORE) and a data bus circuit (DB) differs substantially. Therefore, if their timings are controlled by a common clock signal, the operable clock frequency is determined by a delay in the memory array. Namely, in a synchronous DRAM, unlike the logic LSI chip in FIG. 20A, a delay in each functional block cannot be made almost the same and a pipeline operation using flip-flop circuits (FF) controlled by a common clock signal is impossible; therefore, it is difficult to increase the frequency.

A read operation is explained as an example of an operation performed by the synchronous DRAM shown in FIG. 20B. When command (CMD) and address (ADD) are input to the synchronous DRAM, each of them is received by the flip-flop circuit FF1 at the corresponding input stage in synchronization with the clock signal (CK). The command and address received by the FF1 are decoded by the decoder (DEC); an operation (a read operation in this case) and an address to be selected are determined. The analog delay circuit (ADLY1) delays the clock pulse from the pulse generator (PG) to coincide with this time (timing) and supplies the delayed clock pulse to the clock terminal (CK) of the next flip-flop circuit FF2; a main word line (MWLB) in the selected address is activated in the memory array (MEMCORE).

Then, the analog delay circuit (ADLY2) further delays the pulse delayed by the analog delay circuit (ADLY1) to coincide with a time at which a memory cell (not shown in the figure) selected in the memory array (MEMCORE) generates a signal in a bit line (not shown in the figure) and supplies it to the clock terminal CK of the flip-flop circuit FF3; a sense amplifier activation signal (SAN) is activated and the generated signal is amplified by a sense amplifier (not shown in the figure).

When the successive read command is input, the signal amplified by the sense amplifier (not shown in the figure) is transferred to the output buffer via the data bus circuit (DB); FF4 outputs the signal from the chip through the external data output terminal (DOUT) in synchronization with the clock signal from a counter circuit (COUNT).

Patent Document 1 etc. describes a structure comprising a coarse adjustment circuit for coarsely adjusting a clock phase and a fine adjustment circuit for finely adjusting the clock phase (The constitution described in the Patent Document 1 is extremely different from that of the present invention described in the following). Moreover, Patent Document 2 discloses a timing generation circuit comprising a first DLL (Delay Locked Loop) and a second DLL for supplying power voltage to a coarse delay unit and a fine delay unit in a serial connection, wherein the delay units used as a monitoring circuit for the first DLL and the second DLL have the same circuit form for the coarse delay unit and the fine delay unit.

[Patent Document 1]
JP Patent Kokai Publication No. JP-P2004-110490A

[Patent Document 2]
JP Patent Kokai Publication No. JP-P2006-186547A

[Non-Patent Document 1]
Kohtaroh Gotoh, Shigetoshi Wakayama, Miyoshi Saito, Junji Ogawa, Hirotaka Tamura, Yoshinori Okajima, and Masao Taguchi, 'All-Digital Multi-Phase Delay Locked Loop for Internal Timing Generation in Embedded and/or High-Speed DRAMs', 1997 Symposium on VLSI Circuits Digest of Technical Papers, pp. 107-108

SUMMARY

The entire disclosures of the above Patent Documents and Non-Patent Document are incorporated herein by reference thereto. The following analysis is given by the present invention.

In recent years, variation in device characteristics has become a serious problem because of the progresses in miniaturization and voltage lowering of a MOS transistor and a wire in a LSI circuit.

FIG. 21A is a diagram showing an example of a circuit structure for the above-described analog delay circuit (ADLY). FIG. 21A shows, as an example, a structure of multi-stage inverter circuits (INV) in cascade connection.

FIG. 21B shows a delay in the analog delay circuit (ADLY) in FIG. 21A in the relative value obtained by simulation in various conditions. Here, Low-voltage/High-voltage corresponds respectively to the case where operation voltage fluctuates toward low voltage and to the case where operation voltage fluctuates toward high voltage. Slow/fast corresponds respectively to the case where threshold voltage of a MOS transistor is high and to the case where threshold voltage of the MOS transistor is low. High temp/Low temp corresponds respectively to the case where operation temperature is high and to the case where operation temperature is low.

In FIG. 21B, for example, a combination of Low-voltage, slow, and High temp corresponds to a delay in the case where an operation voltage fluctuates toward low voltage, threshold voltage of a MOS transistor is high and operation temperature is high, in which delay td of the analog delay circuit (ADLY) is large. A combination of High-voltage, fast, and Low temp corresponds to a delay in the case where an operation voltage fluctuates toward high voltage, threshold voltage of a MOS transistor is low and operation temperature is low, in which delay td of the analog delay circuit (ADLY) is small. The other combinations can be interpreted in the same way.

As can be obviously seen in FIG. 21B, the longest delay (maximum delay) is twice of the shortest delay (minimum delay) in the analog delay circuit (ADLY). This large variation in delay in a delay circuit in the synchronous DRAM increases the access time.

FIG. 22A is a diagram schematically showing an operation timing of the circuit blocks in the condition (Best) where a circuit in a synchronous DRAM operates fastest. In FIG. 22A, the horizontal axis represents an operation time for the decoder (DEC), the memory array (MEMCORE) and the data bus circuit (DB).

Delay td1 from the clock signal (CK) to the main word line (MWLB) and delay td2 from the main word line (MWLB) to the sense amplifier activation signal (SAN) are determined so as to avoid overlapping of operation times for these circuit blocks. As shown in FIG. 20B, analog delay circuits (ADLY1, ADLY2) for generating these delays are provided in the timing control circuit (TG). In this case, delay in the analog delay circuit (ADLY1) is denoted by td1 and delay in the analog delay circuit (ADLY2) is denoted by td2.

In FIG. 22B, operation timing of the circuit in its slowest condition (Worst) is shown, when the circuit is designed to have delays determined as described above.

The operation time for each of the circuit blocks, the decoder (DEC), the memory array (MEMCORE) and the data bus circuit (DB) has increased compared with the operation time for each of the circuit blocks in FIG. 22A; besides, delay in the analog delay circuits (ADLY1, ADLY2) has also increased. Since the increase in each of the delays (td1, td2) is larger than the increase in each of the decoder (DEC) and the memory array (MEMCORE), dead margins (DM1, DM2) appear respectively between the end of an operation of the decoder (DEC) and the beginning of an operation of the memory array (MEMCORE) and between the end of an operation of the memory array (MEMCORE) and the beginning of the operation of the data bus circuit (DB). Because of these timing margins, the access time becomes longer than the sum of the delays in each of the circuit blocks, the decoder (DEC), the memory array (MEMCORE) and the data bus circuit (DB). Therefore, there occurs a problem that intrinsic performance of the device and the circuit cannot be utilized.

On the other hand, if delay in the analog delay circuits (ADLY1, ADLY2) is determined without timing margins in the Worst condition as shown in FIG. 22B, operations in the circuit blocks overlap and an error occurs in the operations because operation in the next circuit block is started before end of operation in each circuit block in the Best condition as shown in FIG. 22A (in other words, each of the delays td1 and td2 becomes shorter than the operation time of the decoder (DEC) and that of the memory array (MEMCORE) respectively).

To solve this problem, an example where a digital delay element (circuit) is applied to a memory circuit has been reported. A digital delay element (circuit) generally means a circuit for using a clock signal and a multiphase clock signal and generating a delay which is an integral multiple of their periods. When a digital delay element (circuit) is employed, there is provided an advantage that variation in the delay is small, because a delay determined by the period of externally supplied clock signal can be generated even when the device, the temperature and the power voltage change. As an example, Non-Patent Document 1 discloses a DRAM device wherein a DLL (Delay Locked Loop) circuit generates a multiphase clock signal and the multiphase clock is used in the device.

However, the DLL requires predetermined time (as an example, about 100 cycles) from supply of the clock to synchronization of the delay in the DLL with the clock. Therefore, since the clock cannot be stopped even in the standby mode wherein the DRAM is not in operation, there occurs a problem that the current consumed in the standby mode increases.

According to an aspect of the present invention, there is provided a timing control circuit for receiving an activation signal and a clock signal with a period T1 and for outputting a timing signal. The timing control circuit comprises: a digital delay circuit for generating a first signal with a delay time of m*T1 measured from an edge of a clock signal of a period T1 when an activation signal is input where m denotes a non-negative integer and tda denotes a delay in the analog delay circuit; and an analog delay circuit for receiving the first signal and outputting a timing signal with a delay time of m*T1+tda measured from an edge of the clock signal.

According to the present invention, the timing control circuit preferably comprises a first register circuit and a second register circuit for storing m and tda respectively, wherein values of m and tda can be changed by setting the values to the first register circuit and the second register circuit.

According to the present invention, there is preferably provided a timing control circuit, wherein the digital delay circuit comprises a coarse delay circuit for receiving a value of m from the first and the second register circuit and outputting a coarse timing signal with a delay of m*T1 measured from an edge of the clock signal when the activation signal is input; the analog delay circuit comprises a fine delay circuit for receiving a preset value of tda from the second register circuit and outputting a fine timing signal with a delay of tda measured from the coarse timing signal, and the fine timing signal is the timing signal.

According to the present invention, there is preferably provided a timing control circuit, wherein the coarse delay circuit comprises: a shift register for shifting the clock signal after the activation signal is input; and a first selection circuit for selecting one of outputs from each stage of the shift register in response to a value of m and outputting the clock signal as the coarse timing signal when m cycles has passed since the activation signal has been input.

According to the present invention, there is preferably provided a timing control circuit, wherein the fine delay circuit comprises: one or a plurality of analog delay elements each for receiving the coarse timing signal; and a second selection circuit for selecting and outputting one signal from outputs from the one or a plurality of analog delay elements and the coarse timing signal as the fine timing signal.

According to the present invention, there is preferably provided a timing control circuit, wherein the fine delay circuit comprises: a plurality of analog delay elements in cascade connection at a first stage for inputting the coarse timing signal; and a second selection circuit for selecting and outputting one signal from outputs from the plurality of analog delay elements and the coarse timing signal as the fine timing signal.

According to the present invention, there is provided a semiconductor memory device comprising the timing control circuit aforementioned, wherein timing of at least part of a chip may be controlled by the timing signal.

According to the present invention, there is provided a semiconductor memory device, wherein the semiconductor memory device may be a DRAM; and the timing signal may be used for at least one of cancellation of bit line equalization, activation of a word line, activation of a sense amplifier, activation of a column select line and activation of a main amplifier.

According to the present invention, there is provided a semiconductor memory device, wherein a value stored in the first and the second register circuits can be output in a test mode.

According to the present invention, there is provided a semiconductor memory device, wherein a value stored in the first and the second register circuits can be set externally in a mode.

According to the present invention, there is provided a semiconductor memory device comprising an analog delay generation circuit for receiving and delaying the activation signal, wherein an output from the timing control circuit and an output from the analog delay generation circuit can be selected as the timing signal.

According to the present invention, there is provided a semiconductor memory device, wherein timing of an internal operation of the semiconductor memory device is controlled using output from the analog delay generation circuit when the device is in the standby mode.

According to another aspect of the present invention, there is provided a timing generation system. The system comprises: a first unit for inputting a clock signal with a period T1, an activation signal and a first selection signal (whose value equals m) and outputting a first timing signal with a delay m*T1 measured from an effective edge of the clock signal when the activation signal is activated. The system further comprises a second unit comprising an analog delay circuit for receiving the first timing signal, providing with a delay tda and outputting the first timing signal, receiving a second selection signal (whose value equals n), and outputting a second timing signal with the delay tda measured from an effective edge of first timing signal, wherein the delay tda can be varied by a second selection signal.

According to yet another aspect of the present invention, there is provided a timing control method comprising receiving an activation signal and a clock signal with a period T1 and outputting a timing signal. The method further comprises: outputting the timing signal with a delay time of m*T1+da measured from an edge of the clock signal when the activation signal is input where m denotes a non-negative integer and tda denotes a delay in an analog delay circuit.

The meritorious effects of the present invention are summarized as follows. According to the present invention, there are provided a timing control circuit and a timing control method for starting up in a short time period.

Moreover, according to the present invention, variation in delay of generated timing signals can be reduced, even when the process, the power voltages and the temperature change. Since a semiconductor memory device comprising a timing control circuit of the present invention can eliminate the dead margin, it can reduce the access time.

DETAILED DESCRIPTION OF THE PREFERRED EMBODIMENTS

Figure 1A:
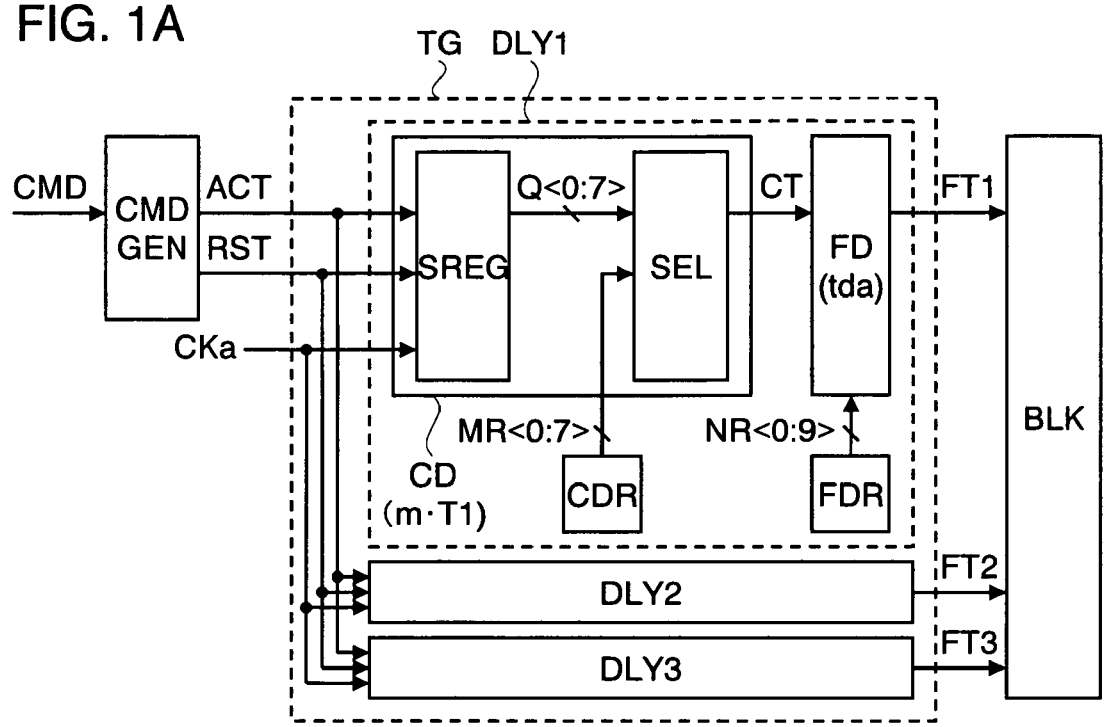
FIGS. 1A and 1B are diagrams showing a structure and an operation waveform of the timing control circuit according to the first exemplary embodiment of the present invention.

A timing control circuit according to a preferred mode of the present invention receives a clock signal with a period T1 and generates a fine timing signal with a delay of nearly td=m*T1+tda measured from the clock signal where m denotes an integer and tda denotes a delay in an analog delay element. In order to generate this timing signal, the timing control circuit comprises a coarse delay circuit (digital delay circuit) and a fine delay circuit (analog delay circuit). The coarse delay circuit comprises a digital counter for counting rising edges of the clock signal after an activation command is received and generates a coarse timing signal with a delay of almost m*T1 measured from the clock signal. The fine delay circuit comprises a plurality of analog delay elements and generates a fine timing signal with a delay of almost tda measured from the coarse timing signal. Here, values of m and the delay tda can be set by a register.

In the following, preferred exemplary embodiments of the present invention are described in detail with reference to the drawings. Identical components are denoted by an identical reference numeral, in principle, throughout the drawings for illustrating preferred modes; an explanation for these components is not repeated. In the drawings, a PMOS transistor is distinguished from a NMOS transistor by adding an arrow at its gate. Although connection of a substrate potential of a MOS transistor is not clearly shown in the drawings, the connection method is not specifically limited, as long as the MOS transistor is in a normally operable range.

First Exemplary Embodiment

Figure 1B:
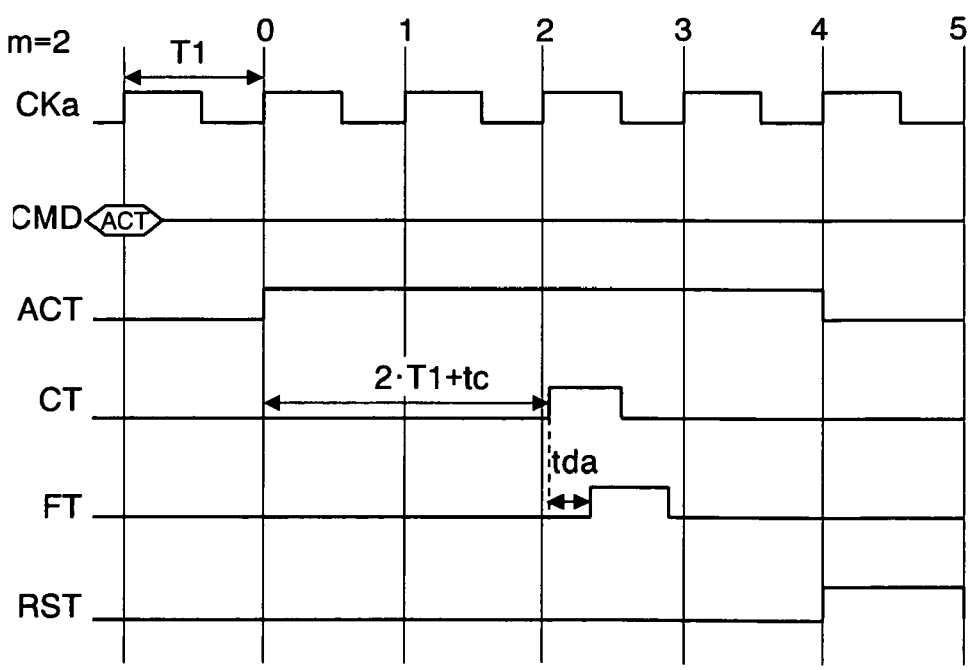

FIG. 1A is a drawing showing a structure of a timing control circuit according to a first exemplary embodiment of the present invention. FIG. 1B is a drawing showing an operation waveform of the timing control circuit in a first exemplary embodiment of the present invention.

With reference to FIG. 1A, the timing control circuit TG of the present exemplary embodiment receives a clock signal CKa with clock period T1. A command CMD is input to a command generator CMDGEN in the memory chip; an activate signal (activation signal) ACT and a reset signal RST generated by the command generator CMDGEN are input to the timing control circuit TG.

The timing control circuit TG comprises a plurality of delay circuits DLY1, DLY2 and DLY3. Fine delay timing signals FT1, FT2 and FT3, each of which is generated by the plurality of delay circuits DLY1, DLY2 and DLY3, are input to a memory block BLK. Each of these timing signals FT1, FT2 and FT3 has a rising edge with a delay m*T1+tda measured from a rising edge of the clock signal CKa when the activation signal ACT is activated, where m denotes an integer and tda denotes a delay in the fine delay circuit FD described in the following. Moreover, in an actual circuit, a fixed delay (a delay which occurs independently of the clock period) tc for the clock signal to traverse the circuit is added.

Although a rising edge of the clock signal CKa is explained as an effective edge in the first exemplary embodiment, it goes without saying that the present invention is not restricted to the structure. It goes without saying that, by choosing a falling edge of the clock signal CKa as an effective edge for example, fine timing signals FT1, FT2 and FT3 having a falling edge with a delay m*T1+tda measured from a falling edge of the clock signal CKa may be generated The delay circuits DLY1, DLY2 and DLY3 have the same structure; an internal structure of only the delay circuit DLY1 is shown in FIG. 1A.

With reference to FIG. 1A, the delay circuit DLY1 comprises a coarse delay circuit CD, a fine delay circuit FD, coarse delay register CDR and a fine delay register FDR. It goes without saying that the coarse delay register CDR and the fine delay register FDR may be shared among the delay circuits DLY1, DLY2 and DLY3, instead of being provided in each of delay circuits DLY1, DLY2 and DLY3.

The coarse delay circuit CD comprises a shift register SREG and a selector SEL. The coarse delay circuit CD receives a clock signal CKa and generates a coarse timing signal CT with a delay m*T1+tc measured from a rising edge of the clock signal CKa when the activate signal ACT is activated. Here, tc denotes a delay intrinsic to the coarse delay circuit CD. The value of m is transferred from the coarse delay register CDR to the coarse delay circuit CD.

FIG. 1B shows an operation waveform when m=2. The fine delay circuit FD generates, with a plurality of analog delay elements, a fine timing signal FT with a delay tda measured form the coarse timing signal CT. Here, a value of tda can be tuned by the fine delay register FDR. A delay from an edge of the clock signal CKa when the activation signal ACT is activated to the fine delay signal FT is given by m*T1+tda+tc, which increases by T1 as the value of m increases by one.

The timing control circuit TG has characteristics that a part of the delay is determined by T1 and m which are less likely to be influenced by variations in the temperature, the power voltage and the devices. Therefore, a ratio (relative portion) of the delay (tda+tc) influenced by these variations can be reduced further; and a timing control circuit for generating a timing signal with a little variation can be constructed. Since the timing control circuit TG can be realized by adding a few circuits to a conventional timing control circuit comprising only an analog delay element, it can prevent increases in its area and power consumption.

Preferably, the above explained preset values stored in the coarse delay register CDR and the fine delay register FDR can be output to a DQ pad not shown in the drawing. For example, debug time can be reduced if it is possible to output the value stored in the coarse delay register CDR and the fine delay register FDR in the test mode. A general method as prescribed by JTAG (Joint Test Action Group) can be employed as a means for outputting to a DQ pad. Preferably, a preset value stored in the coarse delay register CDR and the fine delay register FDR can be changed in the test mode. If a preset value stored in the coarse delay register CDR and the fine delay register FDR can be changed in the test mode, timing adjustment after designing the mask becomes possible, which contributes much to increase the chip yield rate.

Figure 2:
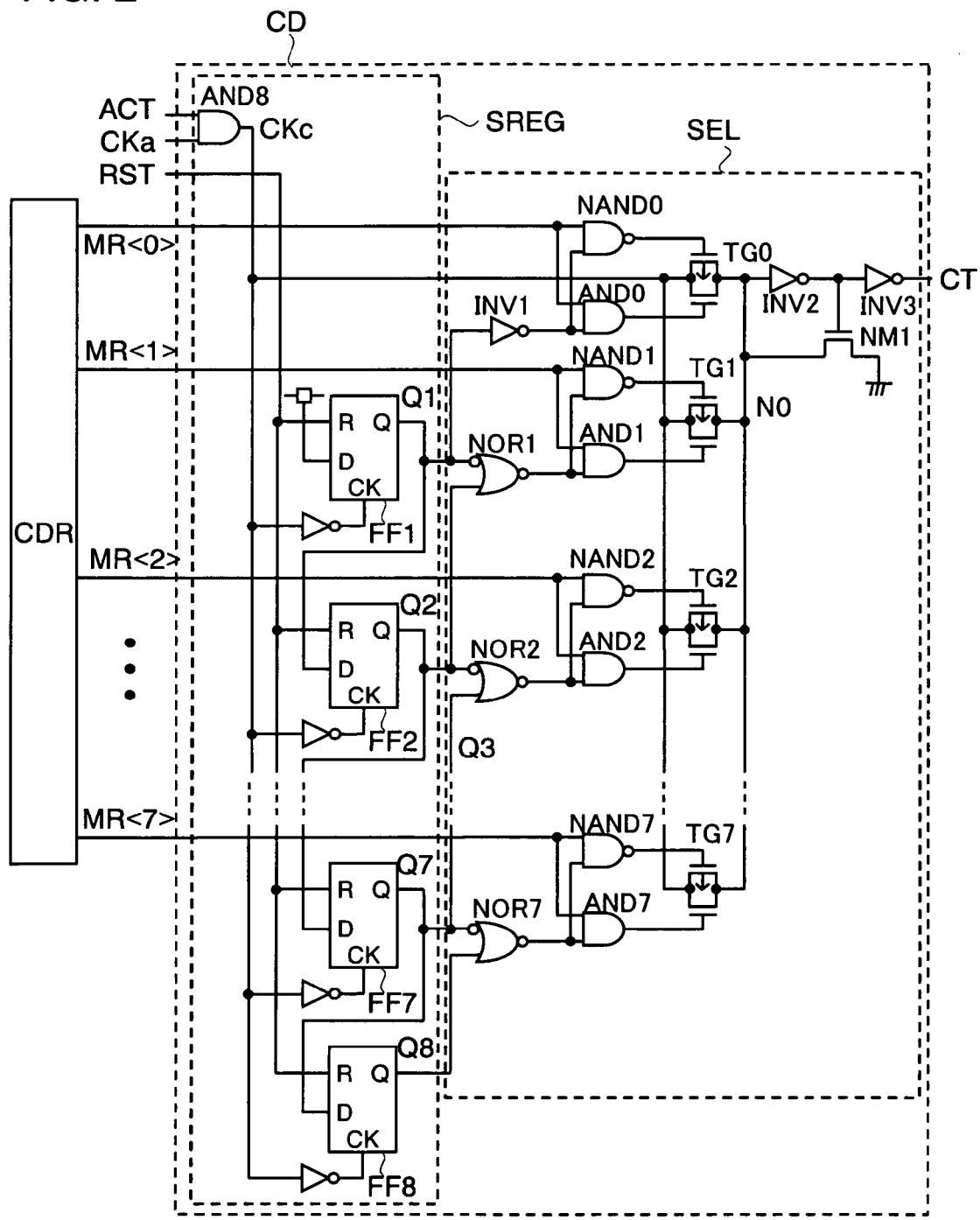
FIG. 2 is a diagram showing an example of a circuit structure of a coarse delay circuit.

FIG. 2 is a diagram showing an example of a circuit structure of the coarse delay circuit. With reference to FIG. 2, the coarse delay circuit CD comprises a shift register SREG and a selector SEL. The shift register SREG comprises a shift register (serving as a counter for counting the clock signal) composed of a plurality of flip-flop circuits FF1 to FF8 in cascade connection. Selecting one of CMOS-type transfer gates TG0, TG1, . . . , TG7 to be on based on m-select signals MR<0:7> from the coarse delay register CDR and output of the corresponding stage of the shift register, the selector SEL generates a coarse timing signal CT with a delay of m periods measured from the clock signal CKa.

An AND gate AND8 receives the activate signal ACT and the clock signal, transfers and outputs the clock signal CKa as a clock signal CKc when the activation signal ACT is in an activated state (High), and outputs a fixed value Low (which masks the clock signal) when the activation signal ACT is in a non-activated state (Low).

The clock signal CKc is commonly input to the multiples of transfer gates TG0, TG1, . . . , TG7 whose outputs are connected commonly to a node N0. The node N0 is connected to CT via an inverter circuit INV2 and an inverter (inverted buffer) circuit INV3.

The transfer gate TG0 which corresponds to an activated MR<0> within the m-select signals is controlled in a way that it selectively becomes an on-state and outputs CKc as CT when an output Q1 from the flip-flop circuit FF1 is Low; and it becomes an off-state and, as a result, outputs a one-shot pulse as CT when an output Q1 from FF1 becomes High in the next clock cycle.

The transfer gate TGi which corresponds to an activated MR<i> within the m-select signals is controlled in a way that it selectively becomes an on-state and outputs CKc as CT when an output Qi from the flip-flop circuit FFi at the corresponding stage is High and an output Qi+1 from the flip-flop circuit FFi+1 at the next stage is Low; and it becomes an off-state and, as a result, outputs a one-shot pulse as CT when an output Qi from the flip-flop circuit FFi at the corresponding stage becomes High and an output Qi+1 from the flip-flop circuit FFi+1 at the next stage becomes High in the next clock cycle. The NMOS transistor NM1 receives an output from INV2; the source is connected to the ground; and the drain is connected to the node N0. NM1 becomes an on-state and discharge the node N0 to the ground potential, when an output from INV2 is High.

More minutely, outputs from a NAND gate NAND0 and an AND gate AND0 are connected respectively to a gate of the PMOS transistor and a gate of the NMOS transistor in the transfer gate TG0. The NAND gate NAND0 inputs MR<0> in the m-select signals MR<0:7> and an output from an inverter INV1 for inverting an output Q1 from the flip-flop circuit FF1. The AND gate AND0 inputs an output from INV1 and MR<0>. If the output Q1 from the FF1 is Low when the activate signal ACT and MR<0> are in an activated state (High), outputs from NAND0 and AND0 become respectively Low and High and TG0 becomes an on-state. If the output Q1 from the FF1 becomes High when the activation signal ACT and MR<0> are in an activated state (High), outputs from NAND0 and AND0 become respectively High and Low and TG0 turns off. Namely, TG0 turns on in the clock cycle 0 (a falling edge of the clock signal CKc starts at 0) and outputs CKc to the node N0 and to CT via the buffers INV2 and INV3.

The data input terminal D of FF1 at the first stage is connected to the power supply (VDD); the clock terminal CK of the flip-flop circuit FF1 receives the inverted signal of the clock signal CKc via the inverter; the output Q1 of FF1 is connected to the input terminal D of FF2 at the next stage and supplied as an inverting input (negative logic input) to the NOR circuit NOR1 (therefore, an inverting output terminal QIB (not shown in the drawing) may be connected to this input of NOR1). The output Q1 of FF1 is input to AND0 via INV1 as described above. An output Q2 of FF2 at the next stage is input to another input terminal of NOR1; an output of NOR1 is input to AND1. Here, NOR1 outputs High when the output Q1 of FF1 is High and the output Q2 of FF2 is Low; and it outputs Low in other cases. Outputs from NAND1 and AND1 are respectively connected to gates of a PMOS transistor and a NMOS transistor in the transfer gate TG1, where NAND1 receives MR<1> and an output from NOR1 and AND1 receives the output NOR1 and MR<1>.

If the output Q1 from the flip-flop circuit FF1 which samples the power supply potential at an falling edge of CKc is High and the output Q2 from FF2 is Low (where the power supply potential has not shifted to FF2 yet) when the activation signal ACT and MR<1> are in an activated state (High), an output of NOR1 becomes High; outputs from NAND1 and AND1 become respectively Low and High; and TG1 turns on. If an output Q1 from FF1 and an output Q2 from FF2 become High (where the power supply potential has shifted to FF2) when the activation signal ACT and MR<1> are in an activated state (High), an output of NOR1 becomes Low at the time; outputs from NAND1 and AND1 become respectively High and Low; and TG1 turns off. Namely, TG1 turns on and outputs the clock CKc to the node N0 and, via the buffers INV2 and INV3, to CT in response to the first falling edge of the clock CKc after the activation signal ACT is activated. When TG1 is an on-state, the node N0 is discharged to ground potential via the NMOS transistor NM1 in response to the transition of CKa from High to Low. Next, the node N0 is discharged to ground potential via the NMOS transistor NM1 in response to the second falling edge of the clock signal Ckc. At the same time, TG1 turns off.

The flip-flop circuits FF2 to FF7 at the following stage have a similar structure. An output from the flip-flop circuit FF8 is input to NOR7 which corresponds to the flip-flop circuit FF7 at the previous stage. Reset terminals R of the FF1 to FF8 are connected commonly to RST; output terminals Q1 to Q8 are reset to Low when RST is High. The flip-flop circuit FF1 samples and outputs a High electric potential (power supply voltage) in response to the first falling edge of CKc. The flip-flop circuits FF2 to FF7 sample and output High electric potentials output from FF1 to FF6 at the previous stage in response to the second to the seventh falling edges of CKc respectively. FF8 samples and outputs a High electric potential output from FF7 in response to the eighth falling edge of CKc.

Figure 3:
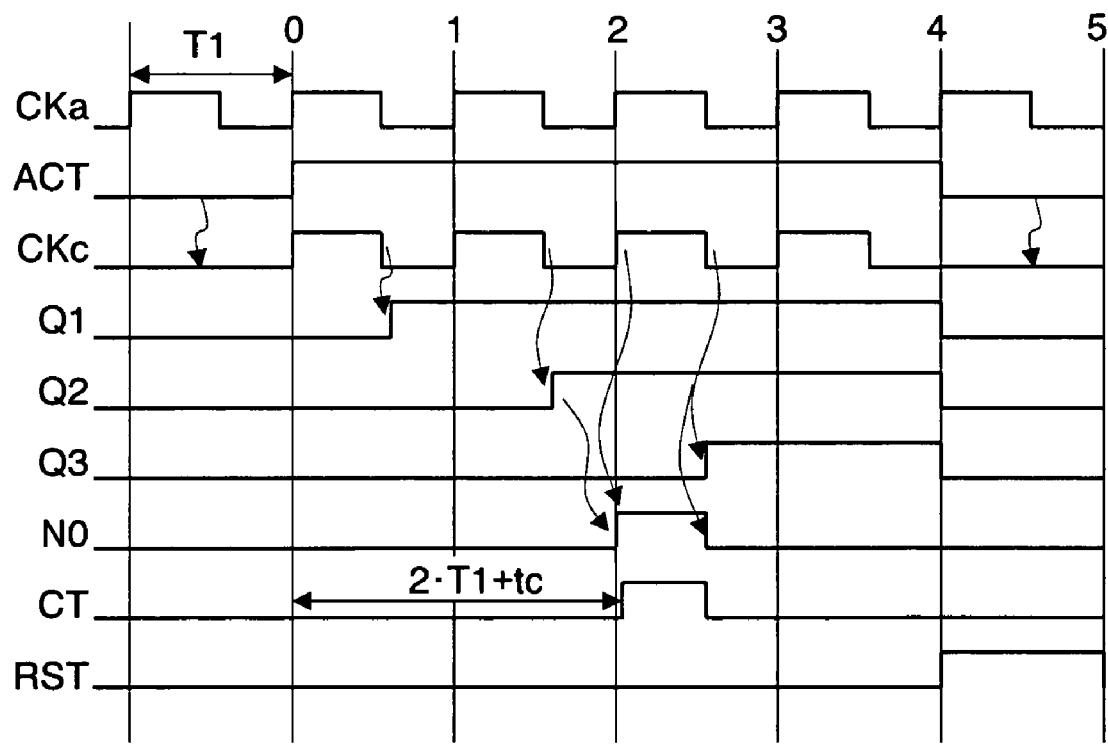
FIG. 3 is a timing chart illustrating an operation of a coarse delay circuit.

FIG. 3 is a timing chart illustrating an operation of the coarse delay circuit in FIG. 2. A signal CKc is a result of the logical AND operation (by AND8 in FIG. 2) between the clock CKa and the activation signal ACT, which is input, as a shift clock, to the shift register comprising FF1 to FF8. Since the shift register receives an inverted signal of CKc, the shift register transfers the High electric potential from Q1 to Q7 per one clock cycle at falling edges of the clock, In FIG. 3, Q1 to Q4 becomes a High electric potential one after another in response to the falling edges of CKc in the clock cycle 0 to 3 after the activation signal ACT becomes High. The outputs Q1 to Q8 from FF1 to FF8 are reset to Low when RST is set to High in the clock cycle 4.

The output terminal Q2 of FF2 transits from Low to High at a falling edge (second falling edge) of CKc in the clock cycle 1, after the activation signal ACT is activated. Since MR<2> is High in the case m=2, the transfer gate TG2 becomes a conducting state via the selectors (AND2, NAND2 and NOR2). Namely, since the output from NOR2 becomes High, the output from NAND 2 becomes Low, and the output from AND2 becomes High when MR<2> is High, the output Q2 from FF2 is High, and the output Q3 from the FF3 is Low, both the PMOS transistor and the NMOS transistor in TG2 turn on. In this state, the second rising edge of CKc passes through the transfer gate TG2 and generates a signal with a delay 2*T1+tc at the node (N0).

Since the output Q2 from FF2 becomes High and the output Q3 from FF3 becomes High after the falling edge (third falling edge) of the Ckc in the clock cycle 2 after the activate signal ACT is activated, the output from NOR2 becomes Low; the output form NAND2 becomes High; the output from AND2 becomes Low; and both the PMOS transistor and the NMOS transistor turn off and are brought into a non-conducting state.

The pulse of clock CKc transferred to the node N0 in the clock cycle 2 is output as a coarse delay timing signal CT via the inverters INV2 and INV3. When the clock CKc transferred to the node N0 transits from High to Low, the output from the inverter INV2 becomes High; the pass transistor NM1 turns on; the charge in the node N0 is discharged; and the node N0 becomes a Low electric potential.

In this way, a single pulse (one-shot pulse) with a delay m*T1+tc where m (MR<0> to MR<7>) is prescribed by CDR can be generated as a coarse timing signal (CT). Here, tc denotes a delay for the clock pulse CKa to pass through the coarse delay circuit (CD). For example, it corresponds to sum of propagation delay times in AND8, the transfer gate, INV2 and INV3.

The coarse timing generation circuit operating in this way can generate a delay varying little against variations in the temperature and the process. Since the negative edge in the previous cycle activates the pass transistor through which the clock signal passes instead of outputting the output from the shift register as the coarse timing signal, the path length in which the clock signal passes can be reduced and the time difference between the output and the clock edge can be reduced. Therefore, there is provided an advantage that the delay time varies little against changes in the process, the voltage and the temperature.

Since all shift registers SREG in the delay circuits operate in the same way when the timing control circuit TG comprises a plurality of delay circuits, a single shift register may be shared among a plurality of selectors (SEL). In this case, the chip area of the timing control circuit can be reduced; and the power consumption can be reduced.

Figure 4:
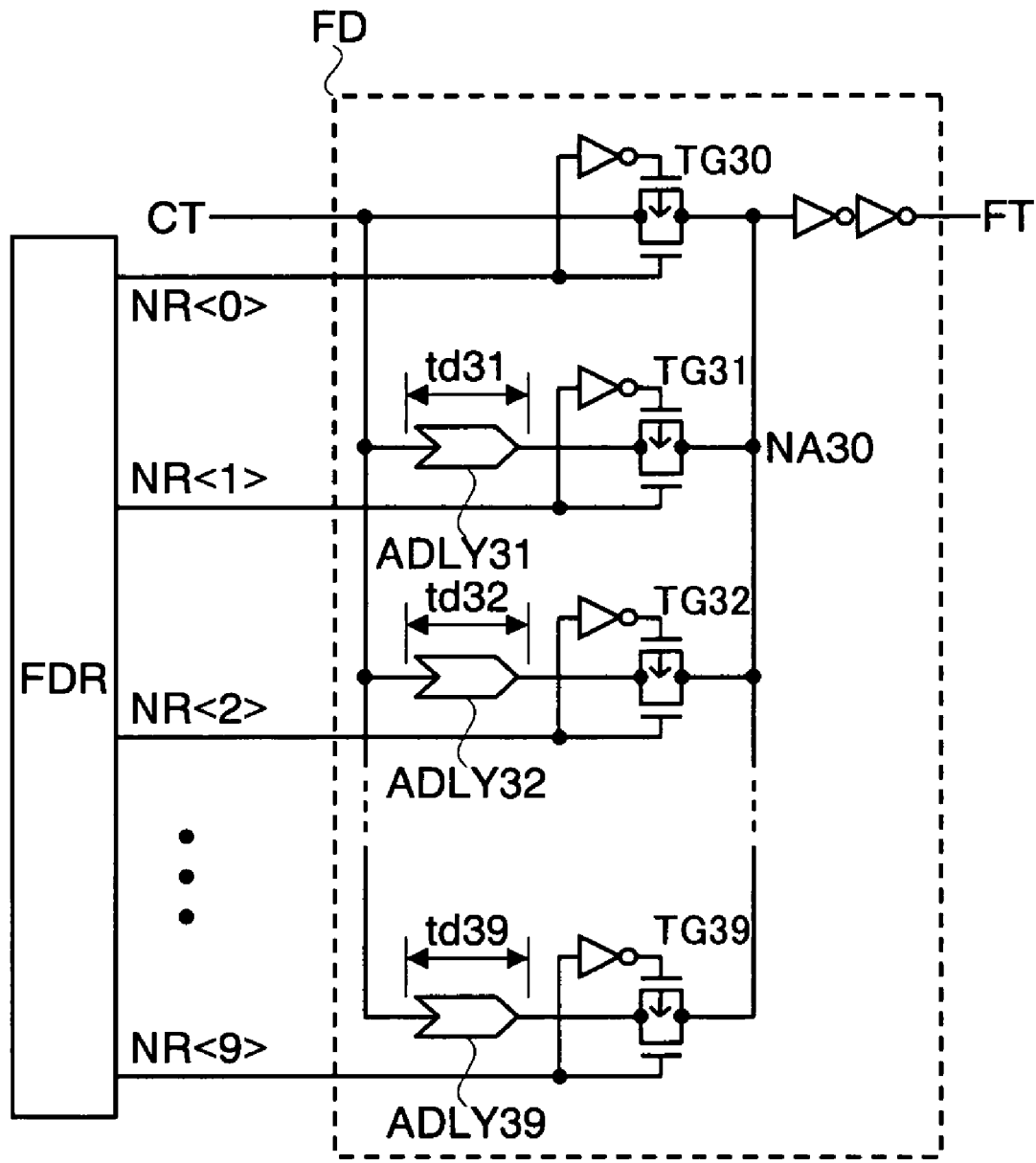
FIG. 4 is a diagram showing an example of a circuit structure of a fine delay circuit.

FIG. 4 is a diagram showing an example of a circuit structure of the fine delay circuit. The fine delay circuit FD comprises: a plurality of analog delay elements ADLY31 to ADLY39 with different delays; and transfer gates (pass transistors) TG30 to TG39. Each of the analog delay elements ADLY31 to ADLY39 receives the coarse timing signal CT and outputs the coarse timing signal CT with delays to one terminal of each of the transfer gates TG31 to TG39. The coarse timing signal CT is directly input to one terminal of the transfer gate TG30. Another terminal of each of the transfer gates TG30 to TG39 is connected commonly to the node NA30. The signal in the node NA30 is buffered and output as a fine timing signal FT.

Figure 21A:
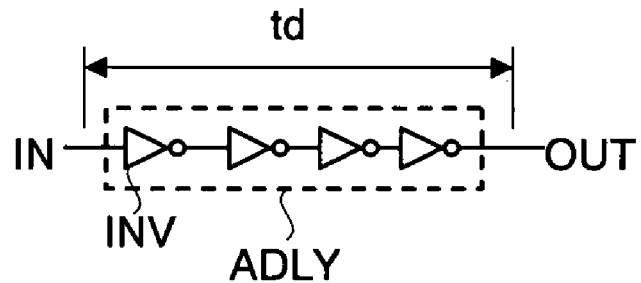
FIGS. 21A and 21B are diagrams showing a circuit structure of an analog delay circuit used in a conventional timing control scheme for a synchronous DRAM and its delay characteristics.
Figure 21B:
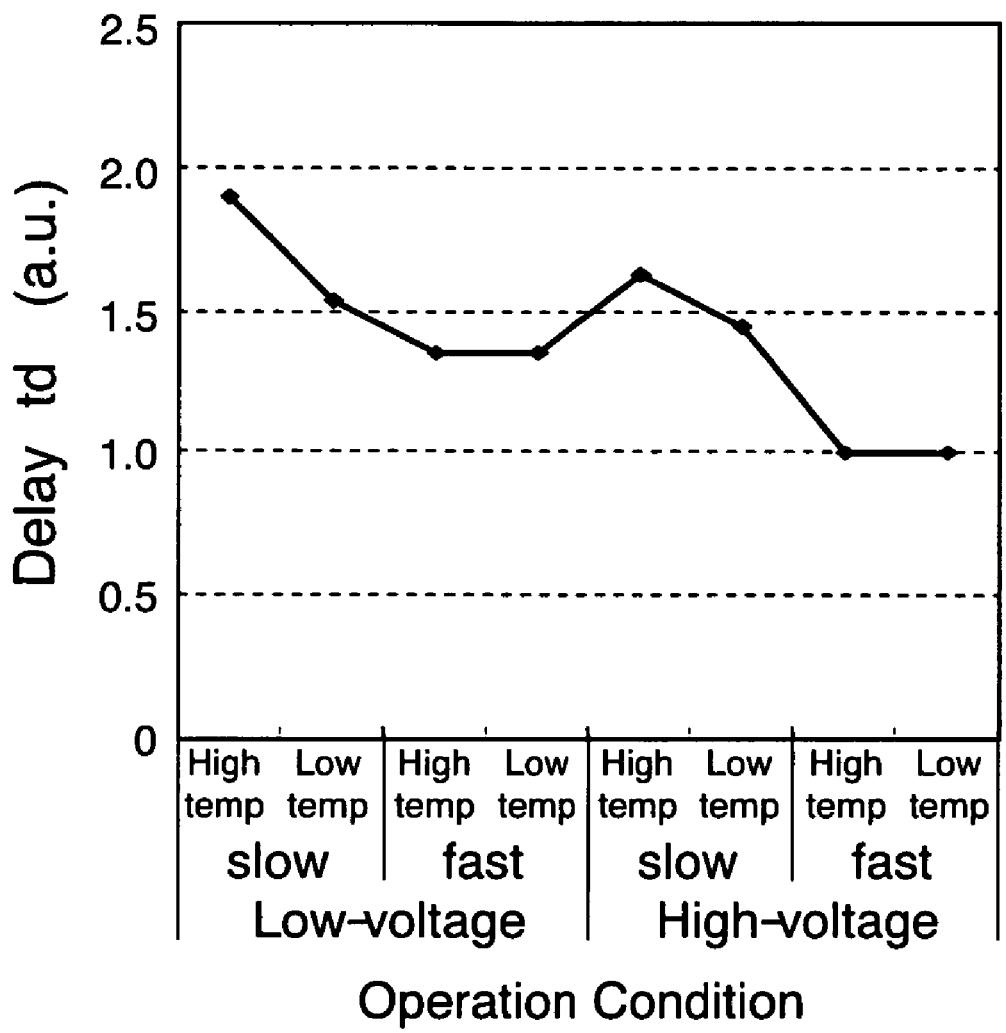
Figure 22A:
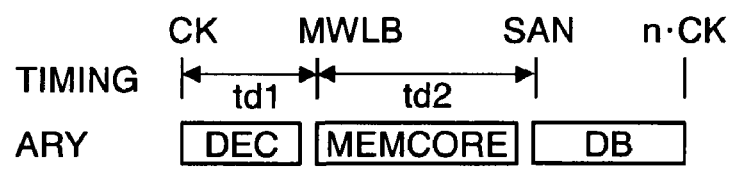
FIGS. 22A and 22B are diagrams showing Best and Worst cases for the operation timings of circuit blocks in the chip when a conventional timing scheme is employed in the synchronous DRAM.
Figure 22B:
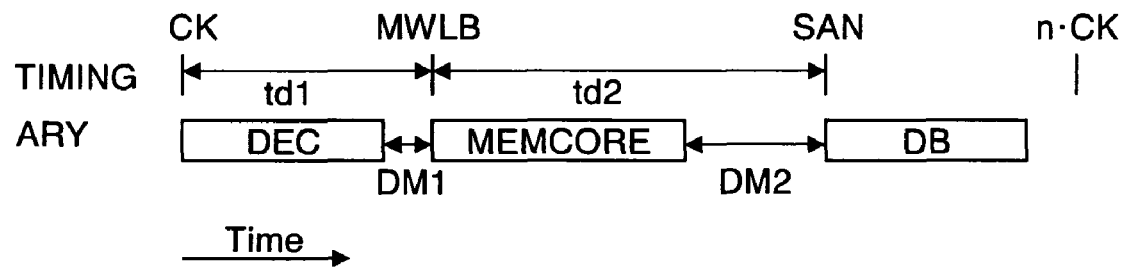

Each of the transfer gates TG30 to TG39 is controlled to open and close by the delay setting signals NR<0:9> output from the fine delay register FDR; and one of the transfer gates TG30 to TG39 is selected. Therefore, the transfer gates TG30 to TG39 work as a selector for outputting the fine delay timing signal FT to which delay tda (one of 0 and td31 to td39 in FIG. 4) is added. The analog delay elements ADLY31 to ADLY39 may comprise, for example, multi-stage inverter circuits INV in cascade connection as shown in FIG. 21A.

Figure 5:
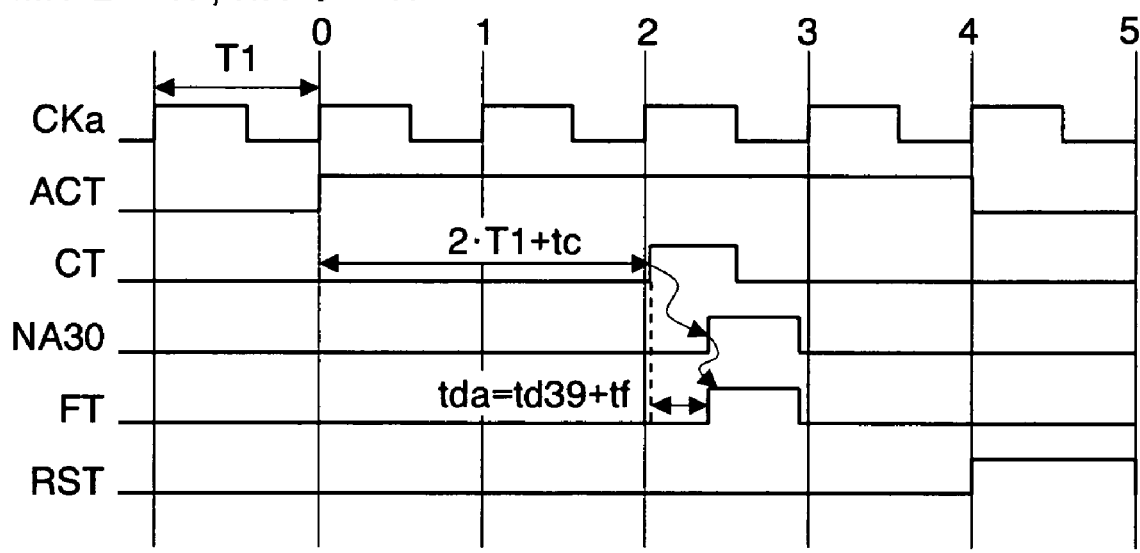
FIG. 5 is a timing charge showing an example of an operation of the fine delay circuit.

FIG. 5 is a timing charge showing an example of an operation of the fine delay circuit. In FIG. 5, if the coarse timing signal CT is input to the fine delay circuit FD when two clock cycles have passed since the activation signal ACT has been activated (clock cycle 2), a plurality of signals with delays of the analog delay elements ADLY31 to ADLY39 from the rising edge of the coarse timing signal CT are generated. The selector (the transfer gates TG30 to TG39) selects one of these signals and outputs it as the fine timing signal FT. The delay setting signals NR<0:9> are used to select the fine timing from these signals. FIG. 5 shows an example where NR<9> is activated. The output signal from the analog delay element ADLY39 passes through the transfer gate TG39 and generates a signal with a delay of td39+tf at the node NA30. This signal is buffered and output as the fine delay timing signal FT. Here, tf denotes a fixed delay for a pulse to pass through the fine delay circuit FD.

Since the fine delay circuit FD comprises a plurality of analog delay elements ADLY31 to ADLY39 with different delays, the fine delay circuit FD can generate a suitable delay tda in response to a desired delay, selection of m and the period of the clock signal CKa. Therefore the dead margin can be reduced and the access time can be reduced.

An RC delay circuit comprising a line resistance and a capacitor element such as a MOS capacitor may be used as the analog delay element. Use of an RC delay circuit reduces variation in a delay in the fine delay circuit compared with a delay circuit comprising inverters in cascade connection.

Figure 6:
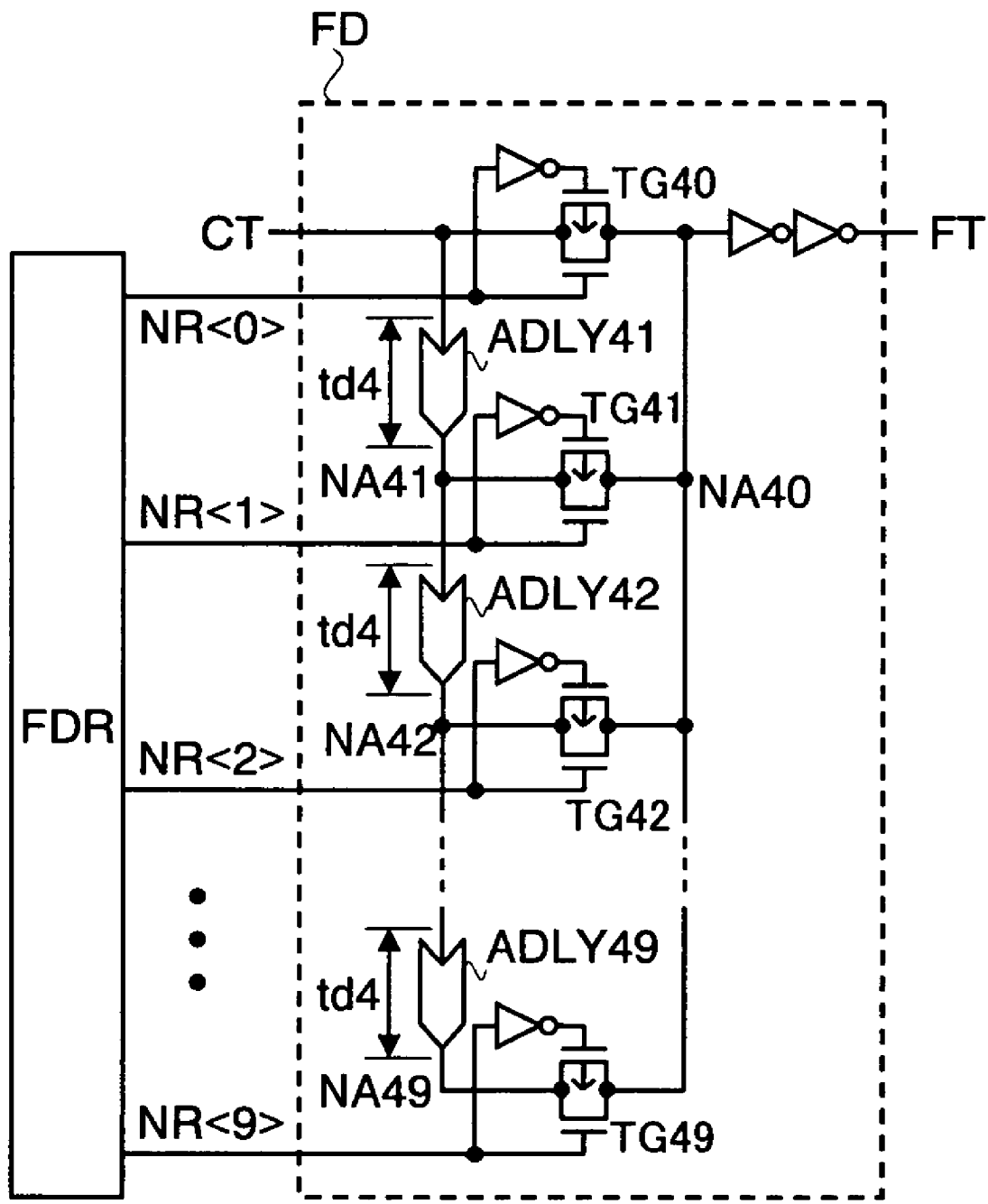
FIG. 6 is a diagram showing another example of a circuit structure of a fine delay circuit.

FIG. 6 is a diagram showing another example of a circuit structure of the fine delay circuit. The fine delay circuit FD comprises a plurality of analog delay element ADLY41 to ALDY49 in cascade connection and transfer gates TG40 to TG49. The analog delay element ALDY41 receives a coarse timing signal CT. Each of inputs for the analog delay elements ADLY42 to ADLY49 is connected respectively to each of outputs from the analog delay elements ADLY41 to ADLY48.

The analog delay elements ALDY41 to ADLY49 output delayed coarse timing signals CT to one terminal of each of the transfer gates TG41 to TG49. One terminal of the transfer gates TG40 directly receives the coarse timing signal CT. Another terminal of each of the transfer gates TG40 to TG49 is connected commonly to the node NA40; and the signal at the node NA40 is buffered and output as a fine delay signal FT.

Each of the transfer gates TG40 to TG49 is controlled to open and close by the delay setting signals NR<0:9> output from the fine delay register FDR; and one of the transfer gate TG40 to TG49 is selected. Therefore, the transfer gates TG40 to TG49 work as a selector for outputting the fine delay timing signal FT to which delay tda (one of 0 and td4 to 9*td4 in FIG. 6) is added.

When the delay of each of the analog delay elements ADLY41 to ADLY49 is identically td4, the delay tda in the fine delay circuit FD can be adjusted within the range between tf and 9*td4+tf where tf denotes a fixed delay for a pulse to pass through the fine delay circuit FD.

Figure 7:
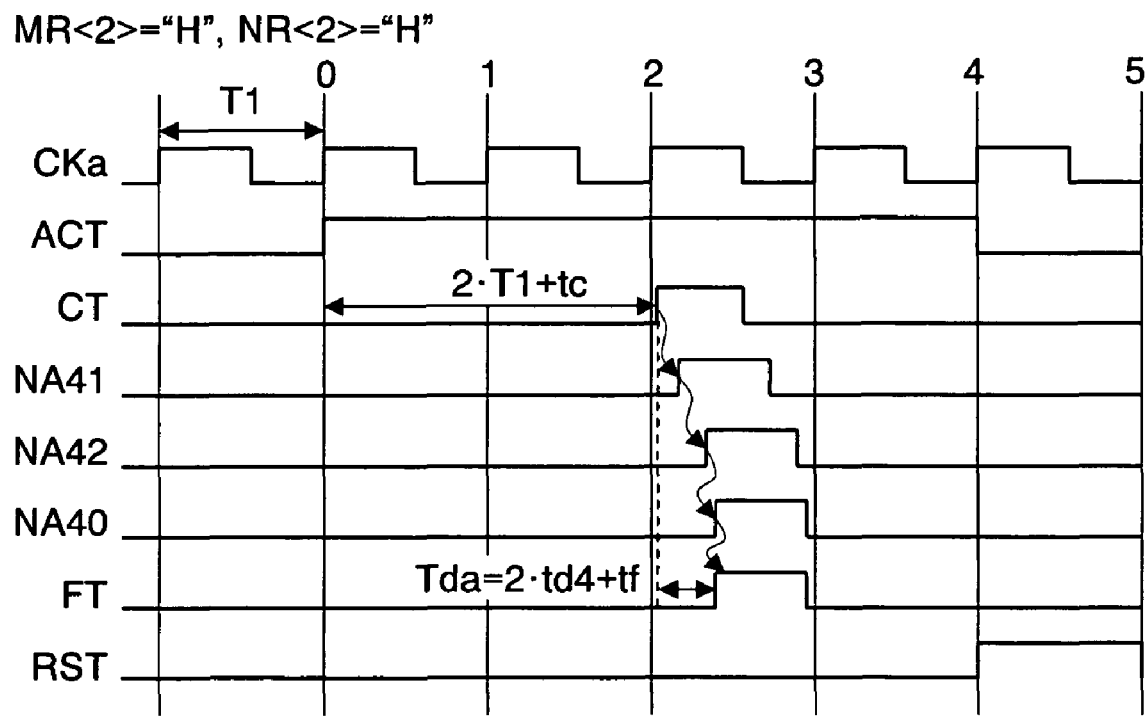
FIG. 7 is a timing chart showing an example of an operation of a fine delay circuit in FIG. 6.

FIG. 7 is a timing chart showing an example of the operation of the fine delay circuit in FIG. 6. In FIG. 7, if the coarse timing signal CT is input to the fine delay circuit FD when two clock cycles have passed since the activation signal ACT has been activated (clock cycle 2), a plurality of signals with delays of the analog delay elements ADLY31 to ADLY39 from the rising edge of the coarse timing signal CT are generated. The selector (the transfer gates TG40 to TG49) selects one of these signals and outputs it as the fine timing signal FT. The delay setting signals NR<0:9> are used to select the fine timing from these signal. FIG. 7 shows an example where NR<2> is activated. The rising edge generated at the node NA42 as an output from the analog delay element ADLY42 passes through the transfer gate TG42 and generates a signal with a delay of 2*td4+tf from the coarse timing signal CT at the node NA40. This signal is buffered and output as the fine delay timing signal FT.

The fine delay circuit FD can adjust the delay tda within the range between tf and n*td4+tf (n is from 0 to 9 in FIG. 6), which makes it possible to adjust the timing after designing the mask and contributes much to the high yield rate.

Figure 8:
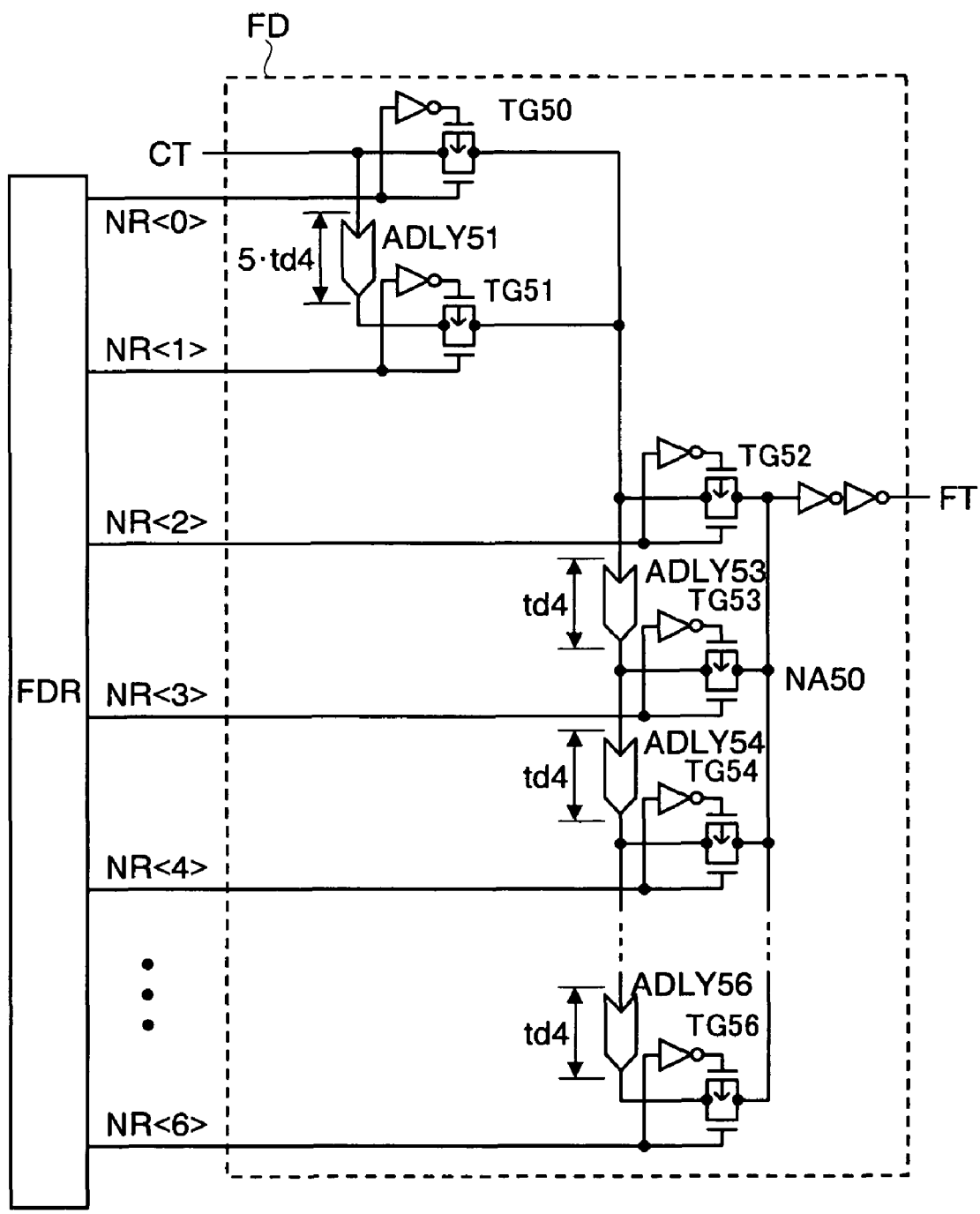
FIG. 8 is a diagram showing yet another example of a circuit structure of a fine delay circuit.

FIG. 8 is a diagram showing yet another example of a circuit structure of the fine delay circuit. Although the fine delay circuit FD in FIG. 6 adjusts the fine delay within the range between tf and n*td4+tf using the n analog delay elements with a delay of td4, the fine delay circuit FD may comprise analog delay elements with different delays. The fine delay circuit FD comprises: an analog delay element ALDY51; a plurality of analog delay element ADLY53 to ALDY56 in cascade connection; and transfer gates TG50 to TG56.

The analog delay element ADLY51 receives a coarse timing signal CT, provides the signal with a delay 5*td4 and outputs the signal to one terminal or the transfer gate TG51. The transfer gate TG50 receives directly the coarse timing signal. Another terminal of each of the transfer gates TG50 and TG51 is connected commonly to the input for the analog delay element ALDY53. Each of inputs for the analog delay elements ADLY54 to ADLY56 is connected respectively to each of outputs from the analog delay elements ADLY53 to ADLY55.

Another terminal of each of the transfer gates TG50 and TG51 and outputs from the analog delay elements ADLY53 to ADLY56 are connected to one terminal of each of the transfer gates TG52 to TG56. Another terminal of each of the transfer gates TG52 to TG56 is connected commonly to the node NA50; and the signal in the node NA50 is buffered and output as a fine delay signal FT.

Each of the transfer gates TG50 to TG56 is controlled to open and close by delay setting signals NR<0:6> output from the fine delay register FDR and one of the transfer gate TG50 to TG51 is selected and one of the transfer gate TG52 to TG56 is selected. Therefore, the transfer gates TG50 to TG56 work as a selector for outputting the fine delay timing signal FT to which delay tda (one of 0 and td4 to 9*td4) is added.

For example, when n is equal to or greater than 5 (the upper limit of n is 9 in FIG. 8), delays ranging between 5*td4+tf and n*td4+tf can be generated by the analog delay element ADLY51 with a delay 5*td4 and the (n−5) analog delay elements ADLY53 to ADLY56 with a delay td4 as shown in FIG. 8. On the other hand, when n is less than 5, delays ranging between tf and 4*td4+tf can be generated only by (n−5) analog delay elements ADLY53 to ALDY56 with a delay td4. By employing a structure like this, the number of analog delay elements and the number of lines for the delay setting signals can be reduced; and the total area of the timing control circuit can be reduced.

An example for controlling the timing in a semiconductor memory device by the above-explained timing control circuit.

Figure 9A:
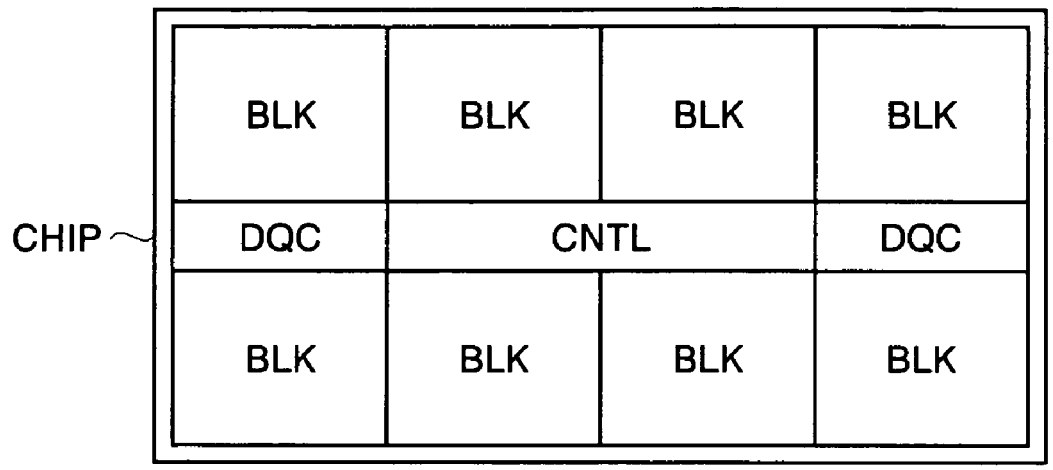
FIGS. 9A and 9B are diagrams schematically showing an example of plan view of the configuration of the chip in the semiconductor memory device according to an exemplary embodiment of the present invention.
Figure 9B:
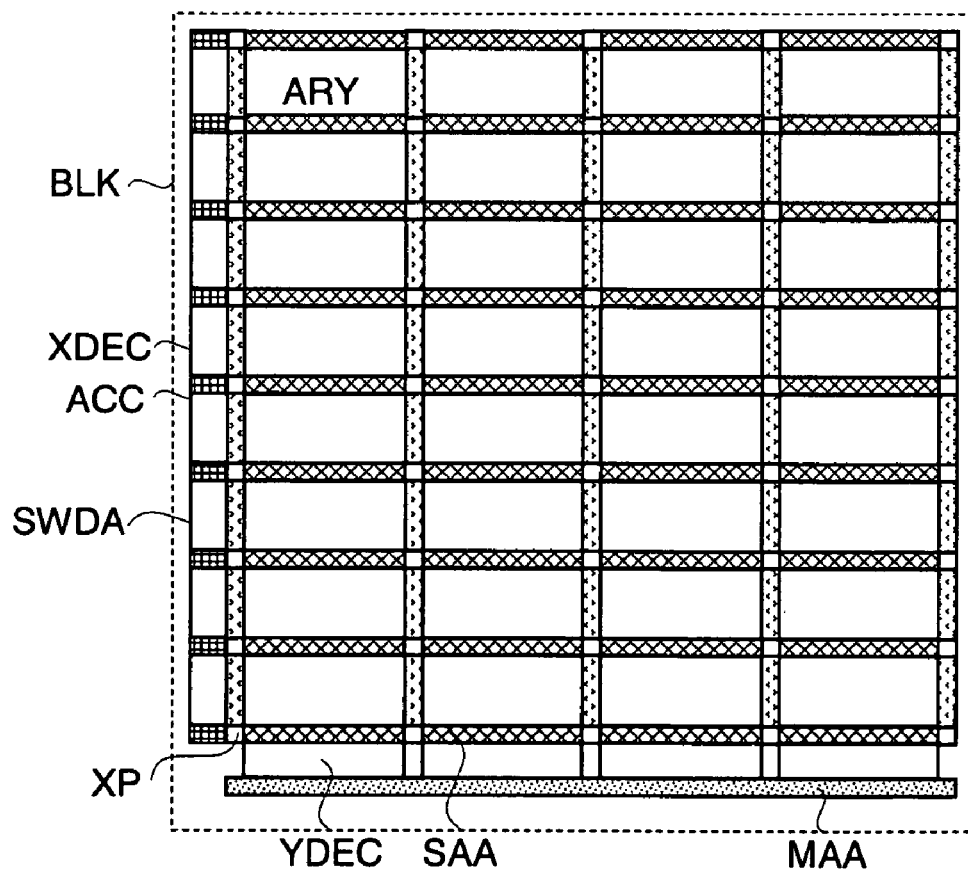

FIGS. 9A and 9B are diagrams schematically showing an example of plan view of a chip structure in a semiconductor memory device according to the first exemplary embodiment of the present invention; FIG. 9A shows an example of a structure of an entire chip; and FIG. 9B shows an example of a structure of memory banks in FIG. 9A.

The semiconductor memory device shown in FIGS. 9A and 9B is a DRAM; and the entire structure of the memory chip CHIP can be divided into a control circuit CNTL, input/output circuits DQC and memory blocks BLK.

A clock signal, an address signal and a control signal are input from outside the memory chip CHIP to the control circuit CNTL to determine the operation mode of the memory chip CHIP and predecode addresses.

The input/output circuit DQC which comprises an input/output buffer receives write data from outside the memory chip CHIP and outputs read data to outside the memory chip CHIP.

As shown in FIG. 9B for example, a plurality of memory array ARY arranged in an array is arranged in the memory block BLK; and a sense amplifier array SAA, a sub-word driver array SWDA and a cross area XP are arranged around the memory array ARY.

Around the memory bank, a column decoder YDEC and a main amplifier array MAA are arranged in parallel to the sense amplifier array SAA; and a row decoder XDEC and an array control circuit ACC are arranged in parallel to the sub-word driver array SWDA.

Figure 10:
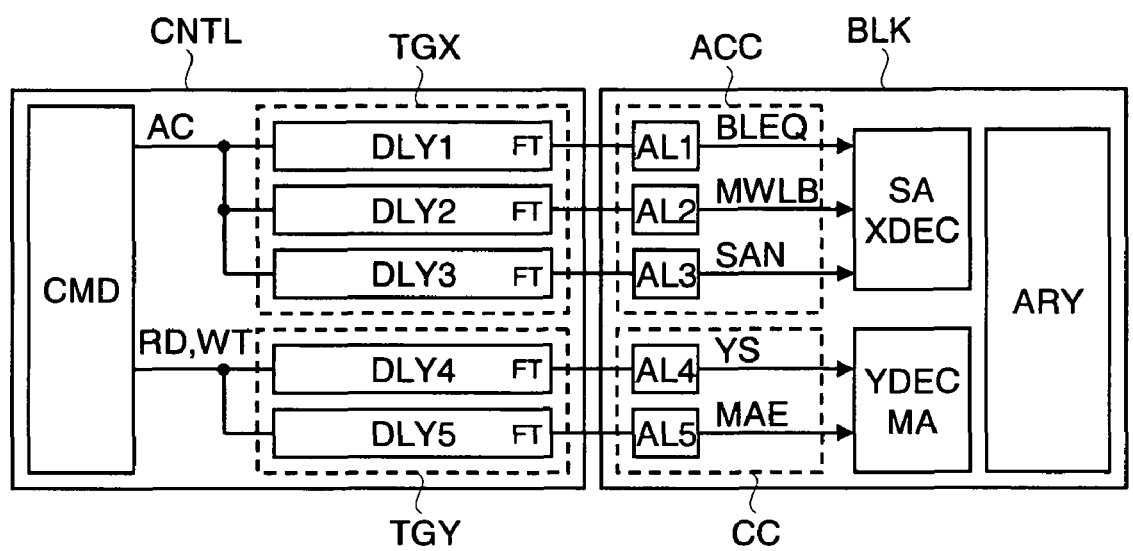
FIG. 10 is a diagram showing an example of a structure of a control circuit and the memory block.

FIG. 10 is a diagram showing an example of a structure of the control circuit CNTL and the memory block BLK. An activate command AC issued by the command decoder CMD is input to the timing control circuit TGX in the above explained structure, in which a fine delay timing signal FT is generated using the fine delay circuits DLY1, DLY2 and DLY3.

The fine timing signal FT generated by the timing control circuit TGX is input to the memory block BLK and, after passing through logic circuits AL1 to AL3 in the array control circuit ACC, used respectively for generating timing signals for: a bit line equalization signal BLEQ used in a sense amplifier SA and a row decoder XDEC; a main word line MWLB; and a sense amplifier activation signal SAN.

Moreover, a read command RD and a write command WT issued by the command decoder CMD are input to the above-explained control circuit TGY, where a fine timing signal FT is generated by delay circuits DLY4 and DLY5. The delay circuits DLY4 and DLY5 have an equivalent structure with the delay circuits DLY1, DLY2 and DLY3.

The fine timing signal FT generated in the timing control circuit TGY is input to the memory block BLK and, after passing through logic circuits AL4 and AL5 in the column control circuit CC, used respectively for generating a timing signal for a column select line YS and a main amplifier activation signal MAE.

Use of the above-explained timing control circuits TGX and TGY can reduce variation in the timing signal caused by changes in the process, the voltage and the temperature can be reduced and reduce the access time.

Figure 11:
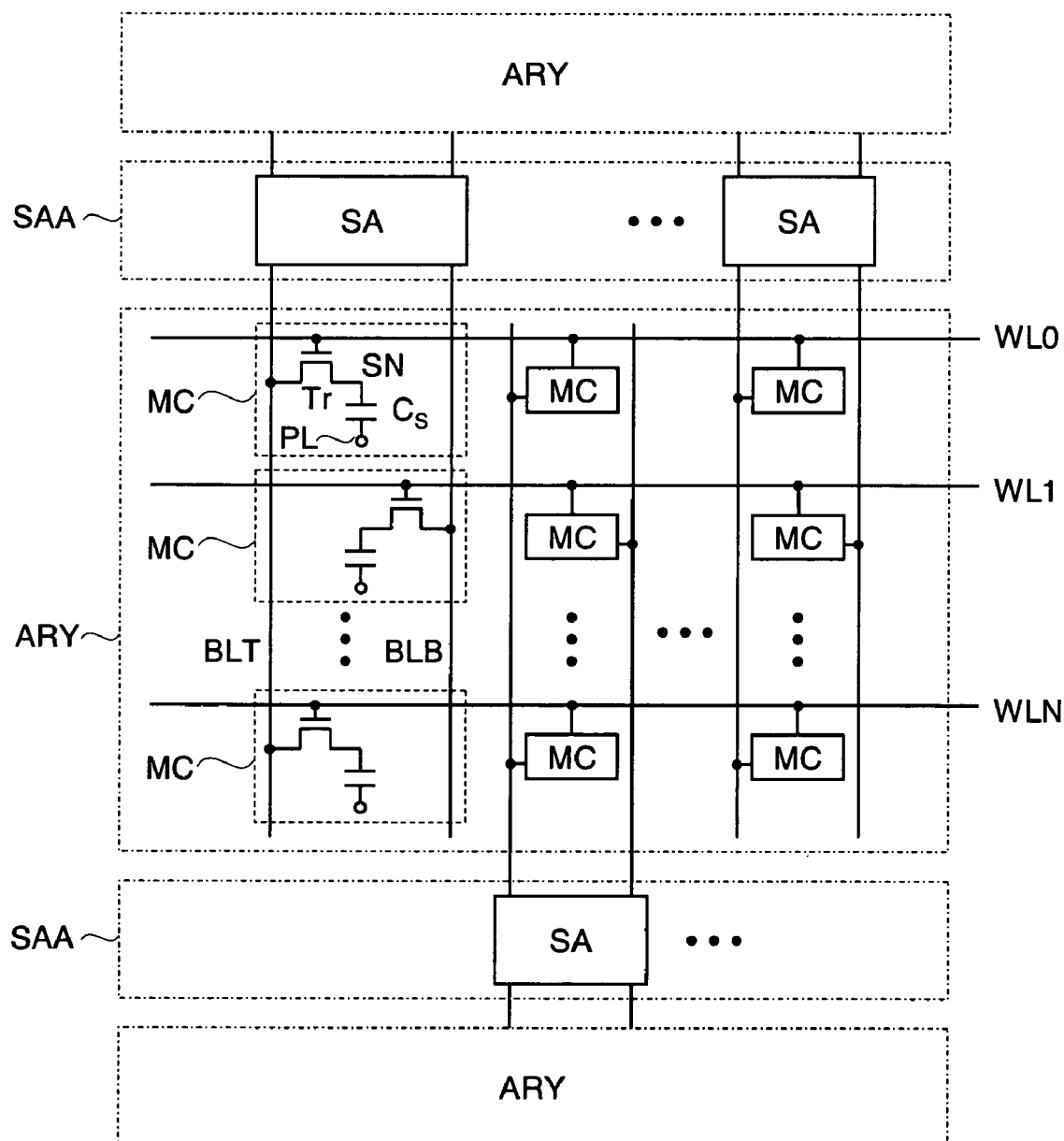
FIG. 11 is an example of a circuit diagram of a memory array (folded bit-line scheme) in the semiconductor memory device in FIGS. 9A and 9B.
Figure 12:
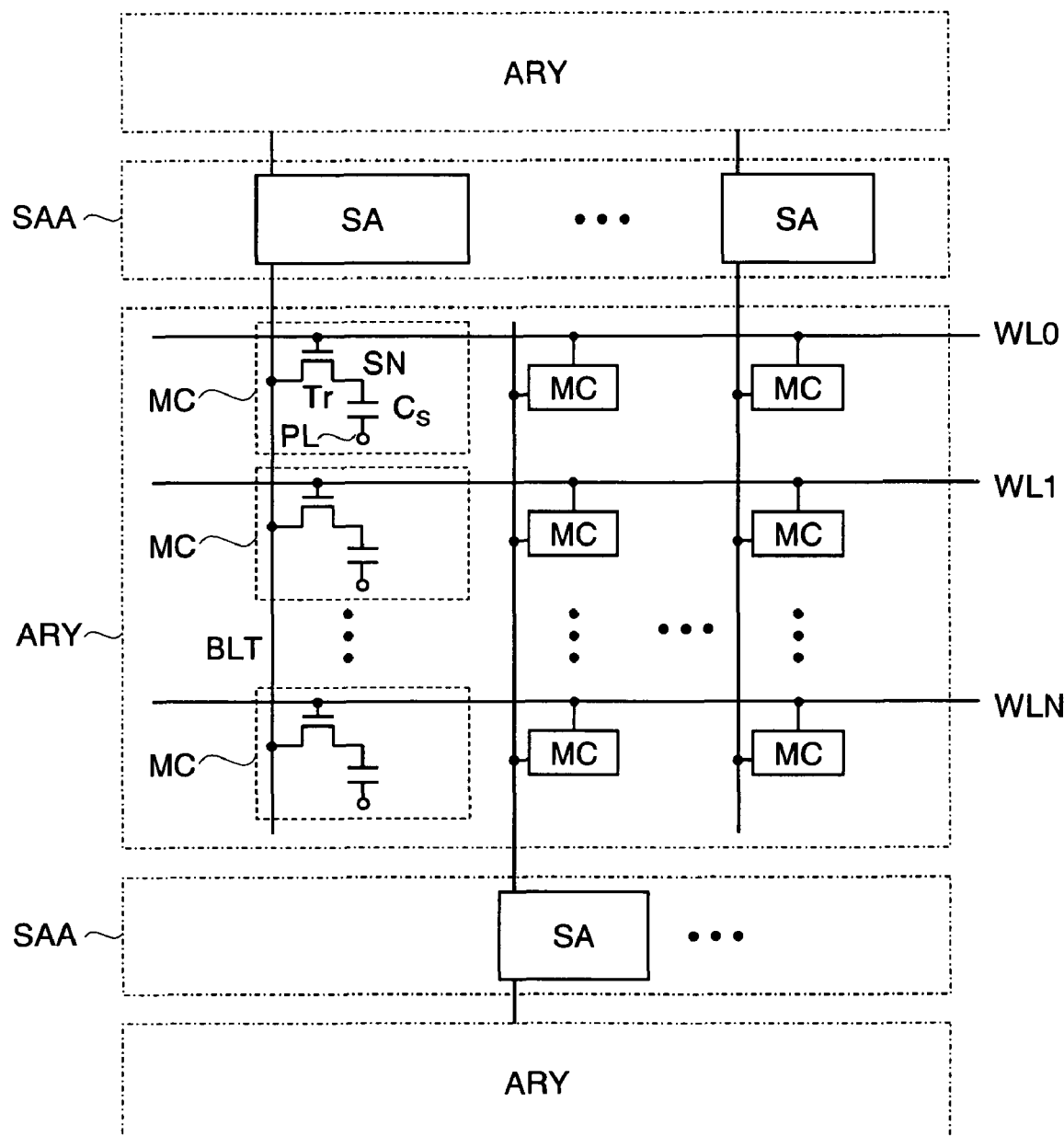
FIG. 12 is another example of a circuit diagram of a memory array (open bit-line scheme) in the semiconductor memory device in FIGS. 9A and 9B.

FIG. 11 and FIG. 12 are diagrams showing examples of a structure of the memory array in the semiconductor memory device in FIGS. 9A and 9B. As shown in FIG. 11 and FIG. 12, a memory array ARY comprises a plurality of memory cells MC. Each memory cell MC is a DRAM memory cell comprising a MOS transistor Tr and a capacitor Cs. One source/drain terminal of a memory cell transistor Tr is connected to a bit line BLT or BLB, another source/drain terminal is connected to the store node SN and the gate is connected to a word line WL.

One terminal of the capacitor Cs is connected to the store node SN; and another terminal is connected to a common plate PL. The bit line BLT and the bit line BLB work as a bit line pair (complementary bit lines) are connected to the same sense amplifier SA.

The sense amplifiers SA in the sense amplifier array SAA is arranged alternately above and below the memory array ARY and connected commonly to the bit line pairs BLT/BLB in the above and below memory arrays ARY and shared between the bit line pairs. Accompanying this, the sense amplifiers SA are arranged with a spacing of a bit line pair between adjacent sense amplifiers in each sense amplifier array SAA. According to this arrangement, the pitch between the sense amplifiers SA is increased, which allows easy layout and miniaturization of the sense amplifiers SA.

An array in the folded bit-line scheme is employed in the configuration shown in FIG. 11 where memory cells are arranged at half of the crossing points between word lines and bit lines. Advantages in this array are low operation noise and large operation margin.

On the other hand, an array in the open bit-line scheme is employed in the configuration shown in FIG. 12 where memory cells are arranged at all of the crossing points between word lines and bit lines. Therefore, there is provided an advantage that the size of the memory cell can be reduced.

Figure 13:
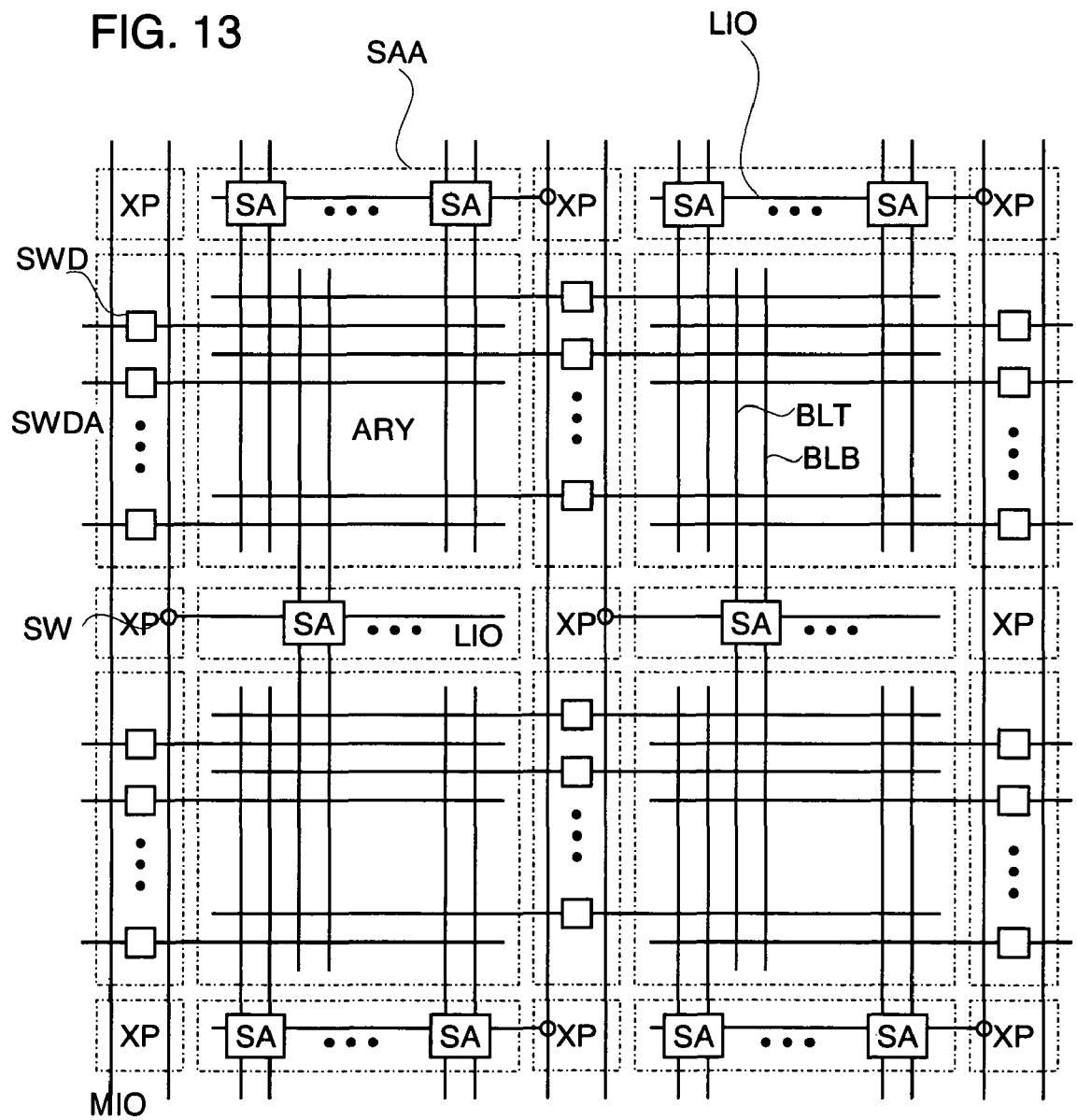
FIG. 13 is a circuit diagram showing a layout of a sub-word driver array and a sense amplifier array in the semiconductor memory device in FIGS. 9A and 9B.

FIG. 13 is a plan view showing an example of the detailed layout of a sense amplifier array and a sub-word driver array in the semiconductor memory device in FIGS. 9A and 9B. As shown in FIG. 13, the sense amplifiers SA in the sense amplifier array SAA is arranged alternately above and below the memory array ARY and connected commonly to the bit line pairs BLT/BLB in the above and below memory arrays ARY.

In a similar manner, the sub-word driver SWD in the sub-word driver array SWDA is arranged alternately to the left and right of the memory array ARY and connected commonly to the word line WL in the left and right memory arrays ARY. According to this arrangement, the pitch between the sub-word drivers in the sub-word driver array SWDA can be increased to twice of the pitch between the word lines WL in the memory array ARY. Therefore, its miniaturization becomes easy.

A local IO line LIO is arranged to the sense amplifier array SAA. The LIO is connected to a main IO line MIO via a switch SW at the cross area XP.

In read operation, data in the sense amplifier SA is read outside the chip via the local IO line LIO and the main IO line MIO; and, in write operation, data is written in from the outside of the chip to the sense amplifier via the main IO line MIO and the local IO line LIO.

Figure 14:
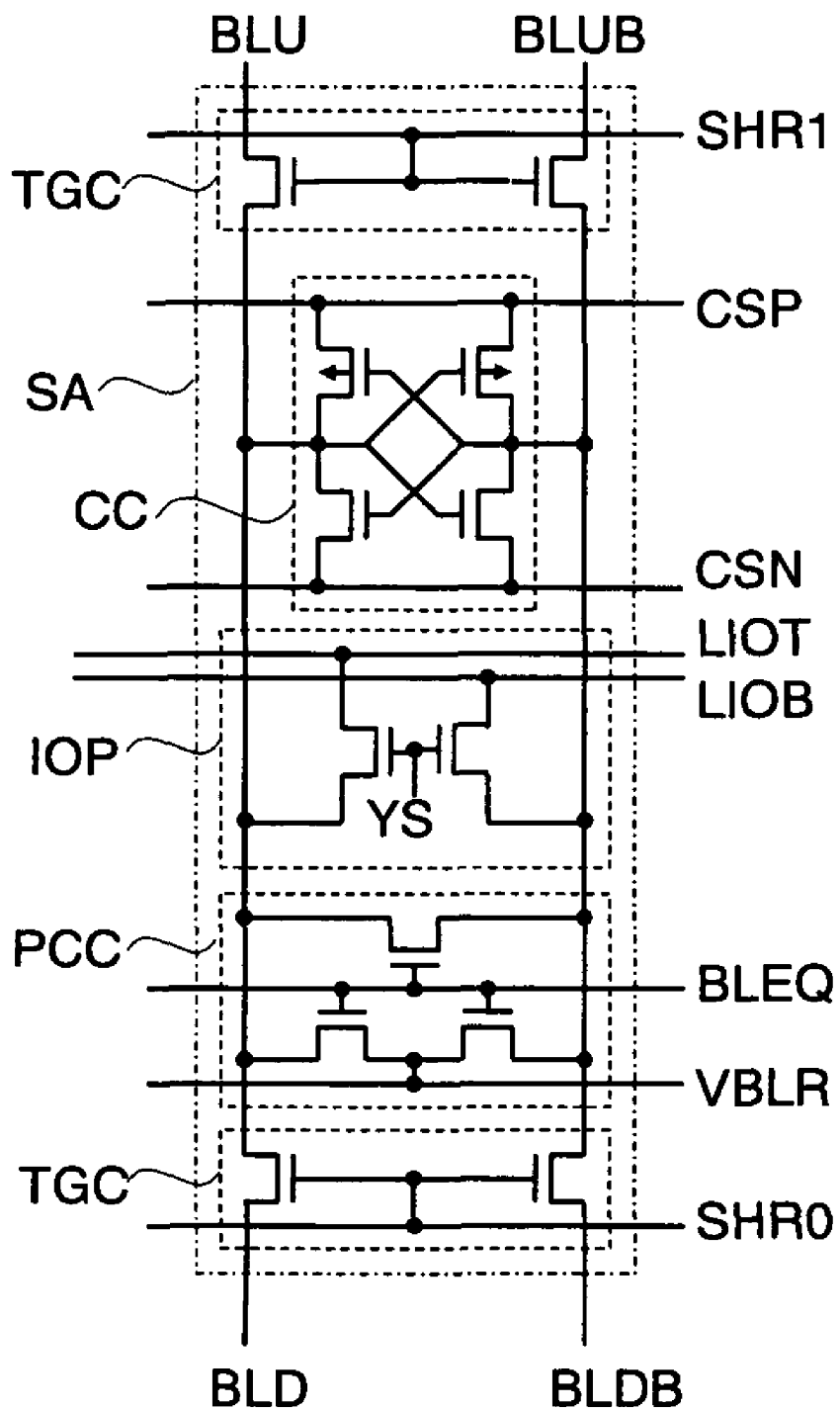
FIG. 14 is a diagram showing an example of a circuit structure of a sense amplifier.

FIG. 14 is a diagram showing an example of a circuit structure of the sense amplifier. Each sense amplifier SA comprises a transfer gate circuit TGC, precharge circuit PCC, a cross-coupled amplifier CC and an read/write port IOP.

The transfer gate circuit TGC is a circuit for connecting the sense amplifier and a bit line pairs BLU/BLUB and BLD/BLDB when sense amplifier separate signals SHR0 and SHR1 are activated.

The precharge circuit PCC equalizes and precharges the bit line pairs BLU/BLUB and BLD/BLDB to a bit line precharge level VBLR when the bit line precharge signal BLEQ is activated. The bit line precharge level VBLR is set to a middle value VDL/2 of the voltage amplitude VDL (the same level with the power voltage VCC or a reduced level from the voltage) in the bit line.

The cross-coupled amplifier CC is a circuit for: amplifying one bit line with a higher voltage of the selected bit-line pairs to VDL and the other bit line with a lower voltage to VSS by driving a common source line at the PMOS transistor side CSP to the voltage VDL and a common source line at the NMOS transistor side CSN to the ground voltage VSS; and latching the amplified voltage after a read-out signal from the memory cell MC is generated on one of bit-line pairs selected from the bit-line pairs BLU/BLUB and BLD/BLDB.

The read/write port IOP is a circuit for connecting the local IO lines (LIO lines) LIOT/LIOB and a bit line pair selected from the bit line pairs BLU/BLUB and BLD/BLDB when the column select line YS is activated. The LIO line LIOT/LIOB is kept at a precharge level in the standby mode to avoid current consumption in a sense amplifier array SAA which is not selected.

Figure 15:
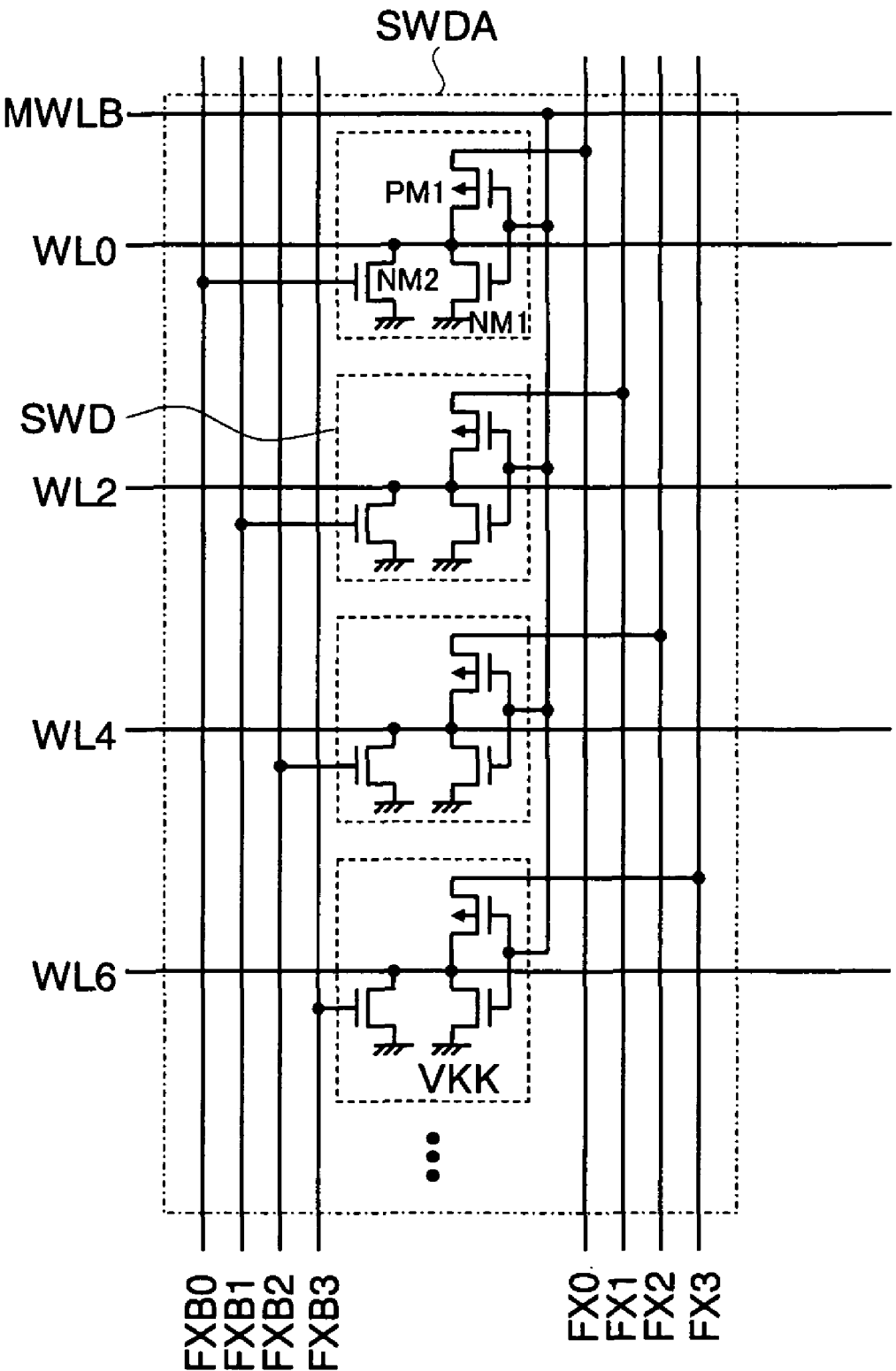
FIG. 15 is a diagram showing an example of a structure of a sub-word driver array in the semiconductor memory device in FIGS. 9A and 9B.

FIG. 15 is a diagram showing an example of a structure of the sub-word driver array SWDA in the semiconductor memory device in FIGS. 9A and 9B. The sub-word driver array SWDA comprises a plurality of sub-word drivers SWD. The sub-word driver array SWDA is arranged around the memory array ARY as shown in FIG. 9B.

The sub-word driver SWD drives a word line WD in the memory array arranged on both sides of the driver. As explained with reference to FIG. 13, since the sub-word driver SWD in the sub-word driver array SWDA is arranged alternately to the memory array ARY, the word line WL (sub-word line) in the memory array ARY is connected alternately to left and right sub-word drivers SWD The sub-word driver SWD comprises two n-channel MOS transistors NM1 and NM2 and a p-channel MOS transistor PM1. The gate of the first n-channel MOS transistor NM1 is connected to the main word line MWLB; the drain is connected to the word line WL; and the source is connected to the voltage VKK. The gate of the second n-channel MOS transistor NM2 is connected to a complementary word driver select line FXBi (i=0, 1, 2, 3); the drain is connected to the word line WL; and the source is connected to the voltage VKK. The voltage VKK is a voltage lower than the voltage VSS generated in a negative voltage generation circuit.

The gate of the p-channel MOS transistor PM1 is connected to the main word line MWLB; the drain is connected to the word line WL; and the source is connected to the sub-word driver select line FXi (i=0, 1, 2, 3).

Four sub-word driver select lines FX0 to FX3 are connected to a sub-word driver array SWDA. Selecting one of the four sub-word driver SWD by a main word line MWLBA, a word line WL is activated.

Figure 16:
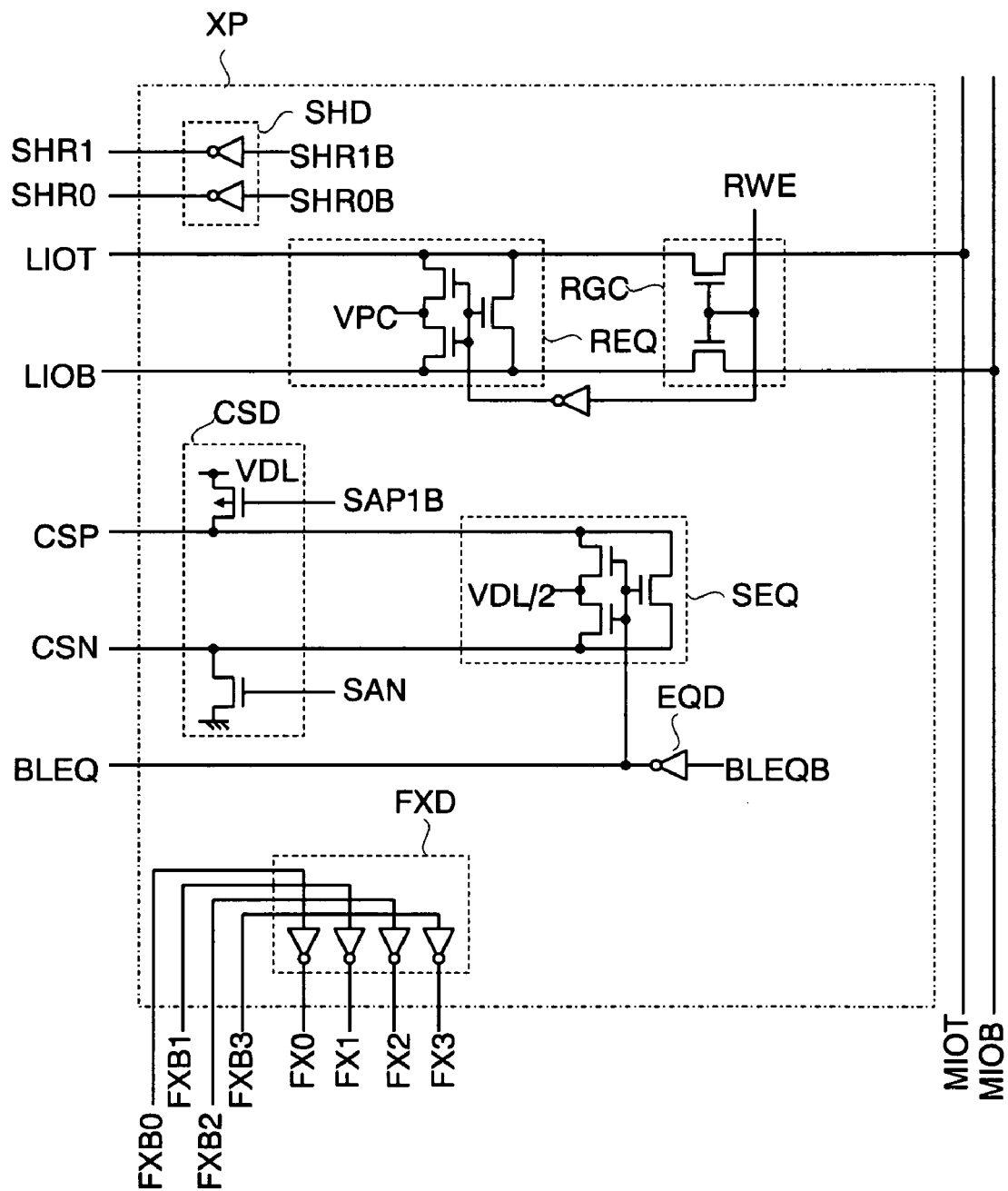
FIG. 16 is a diagram showing an example of a structure of a cross area in the semiconductor memory device in FIGS. 9A and 9B.

FIG. 16 is a diagram showing an example of a structure of the cross area XP in the semiconductor memory device in FIGS. 9A and 9B. With reference to FIG. 16, a SHR signal driver SHD, a LIO line precharge circuit REQ, a read/write gate RGC, a CS line driver CSD, a CS line precharge circuit SEQ, a BLEQ signal driver EQD and a FX line driver FXD are arranged in the cross area XP.

The SHR signal driver SHD receives and outputs an inverted signal of a complementary signal SHRB which is complementary to a SHR. The LIO line precharge circuit REQ precharges LIO lines LIOT/LIOB to a voltage VPC while a read/write enable signal RWE is at a non-active state VSS level.

The read/write gate RGC connects LIO lines LIOT/LIOB and MIO lines MIOT/MIOB, respectively, when the read/write enable signal RWE is at an active state voltage VCL (which is at an identical level with an external VCC level or at a level reduced from it and used as a power voltage for peripheral circuits).

The CS line driver CSD drives the common source line CSN (see FIG. 14) at the side of NMOS of the sense amplifier to the ground voltage VSS when the sense amplifier enable signal SAN at the NMOS side is activated, and drives the common source line CSP (see FIG. 14) at the side of the PMOS of the sense amplifier to a voltage VDL (High level of the bit line) when the sense amplifier enable signal SAP1B at the PMOS side is activated (to a VSS level).

The CS line precharge circuit SEQ precharges the common source lines CSP and CSN (see FIG. 14) at the sides of PMOS and NMOS of the sense amplifier when the BLEQ signal is activated.

A BLEQ signal driver EQD receives and outputs an inverted signal of a complementary signal BLEQB which is complementary to the precharge signal BLEQ.

Second Exemplary Embodiment

Figure 17A:
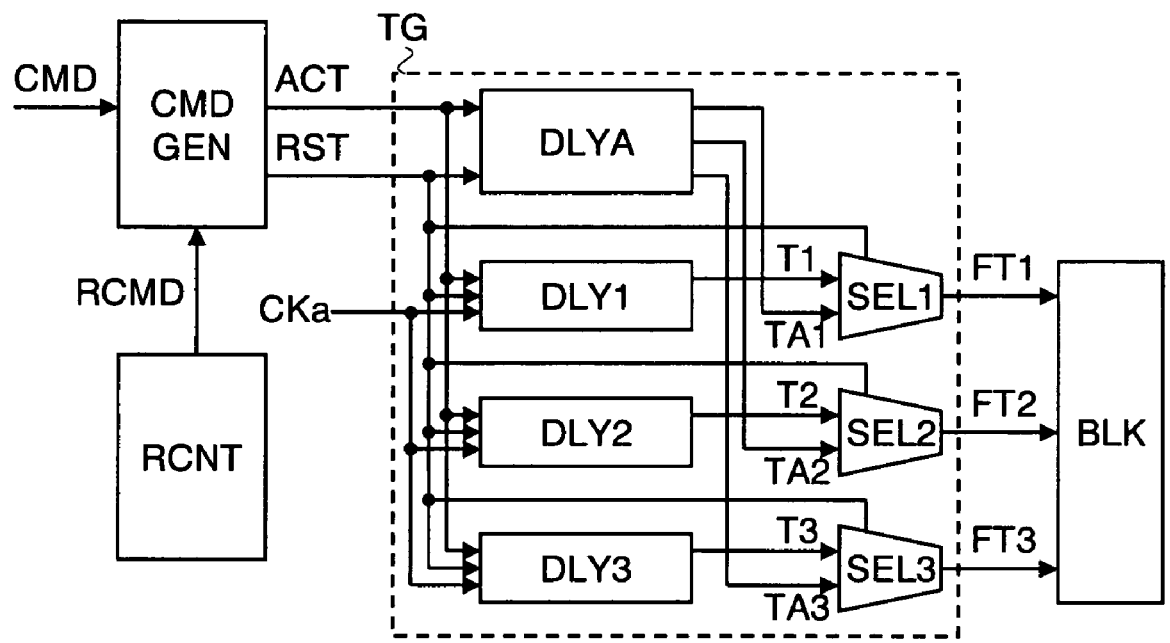
FIGS. 17A and 17B are diagrams showing a structure of a timing control circuit and a selector according to a second exemplary embodiment of the present invention.

FIG. 17A is a drawing showing a structure of a timing control circuit according to the second exemplary embodiment of the present invention. The difference between the timing control circuit in FIG. 17A and the timing control circuit in FIG. 1 is that the timing control circuit TG in FIG. 17A comprises an analog delay generation circuit DLYA and selectors SEL1, SEL2 and SEL3 in addition to the delay circuits DLY1, DLY2 and DLY3.

The analog delay generation circuit DLYA comprising an analog delay element delays an activate signal ACT and a reset signal RST and outputs output signals TA1 to TA3. Each of the selectors SEL1, SEL2 and SEL3 selects one of the output signals TA1 to TA3 and output signals T1 to T3 each output from the delay circuits DLY1, DLY2 and DLY3; and outputs as fine timing signals FT1 to FT3. A command CMD controls which output should be used among the outputs from the delay circuits DLY1, DLY2 and DLY3 and the analog delay generation circuit DLYA.

According to the timing control circuit with this structure, using the analog generation circuit DLYA which does not need a clock CKa, a circuit in the DRAM can be operated only by a refresh command RCMD generated by the refresh counter RCNT, even when the clock CKa is not supplied in the standby mode. Since the operation in the memory array in the standby mode is relatively slower than that in the active mode, designing the timing with a conventional analog delay element does not cause a problem in the operation.

Figure 17B:
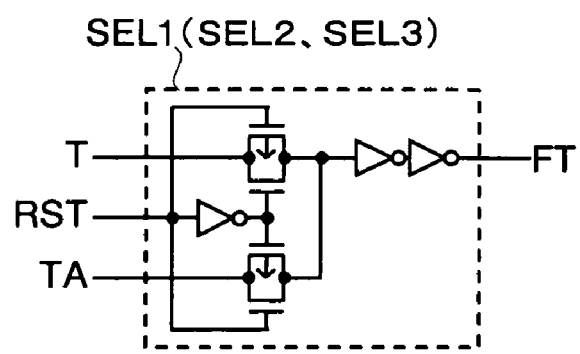

FIG. 17B is a circuit diagram of the selector SEL1 (SEL2, SEL3). The selector SEL1, using the reset signal RST generated in the command generator CMDGEN in the memory chip, selects and outputs one of outputs T1 to T3 from the delay circuits and outputs TA1 to TA3 from the analog delay circuits each corresponding to one of the outputs T1 to T3.

Figure 18:
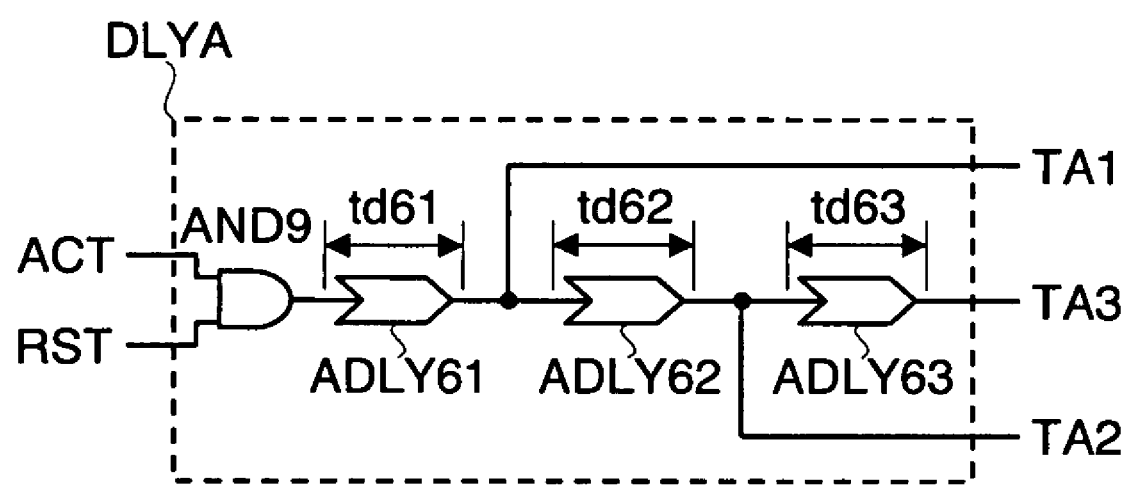
FIG. 18 is a circuit diagram of an analog delay generation circuit.

FIG. 18 is a circuit diagram of the analog delay generation circuit DLYA. The analog delay generation circuit DLYA comprises: an AND circuit AND9 for receiving an activate signal ACT and a reset signal RST and generating a logical AND; and analog delay elements ADLY61 to ADLY63 in cascade connection for receiving an output from the AND circuit AND9. The analog delay generation circuit DLYA receives an activate signal ACT and a reset signal RST both generated by the command generator CMDGEN and outputs signals TA1 to TA3 output respectively from analog delay elements ADLY61 to ADLY63.

Figure 19:
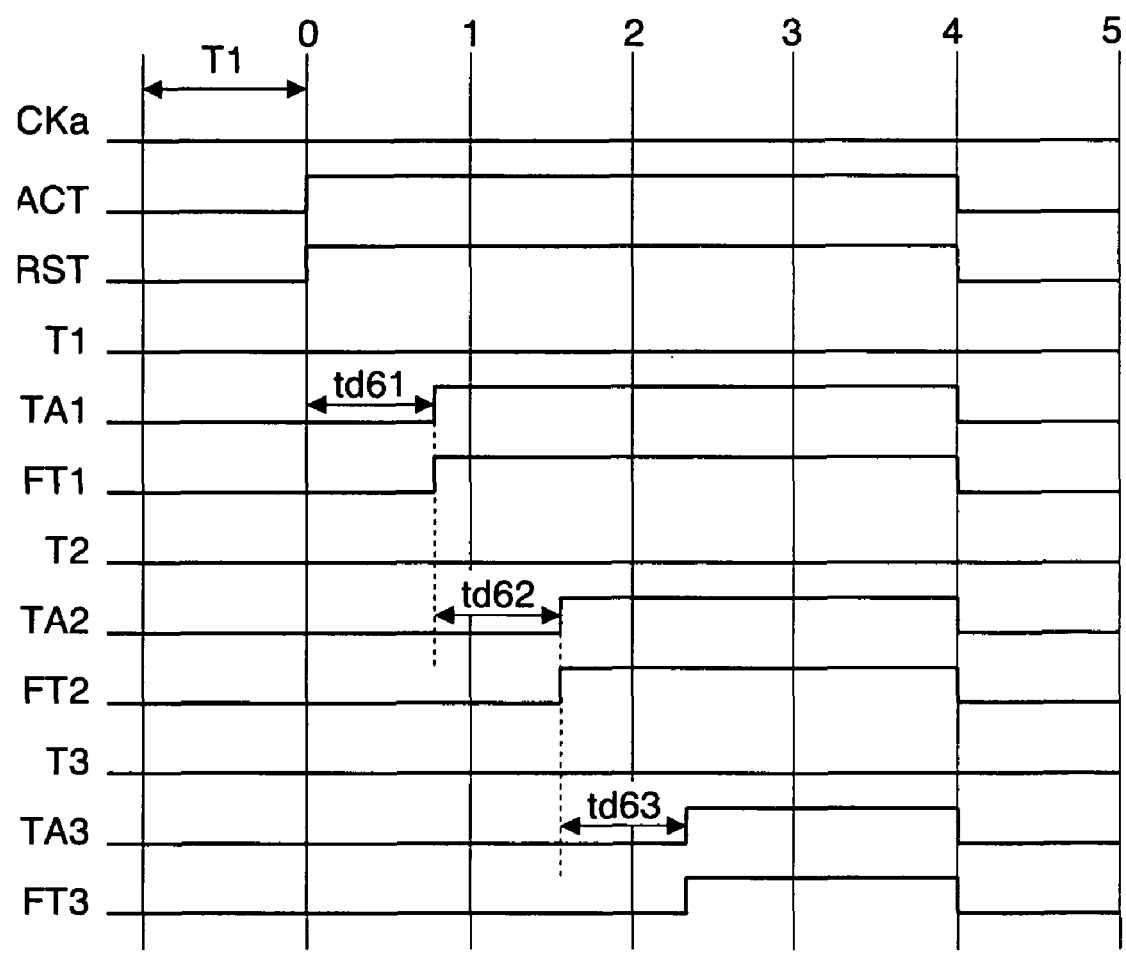
FIG. 19 is a timing chart showing an operation of the analog delay generation circuit.
Figure 20A:
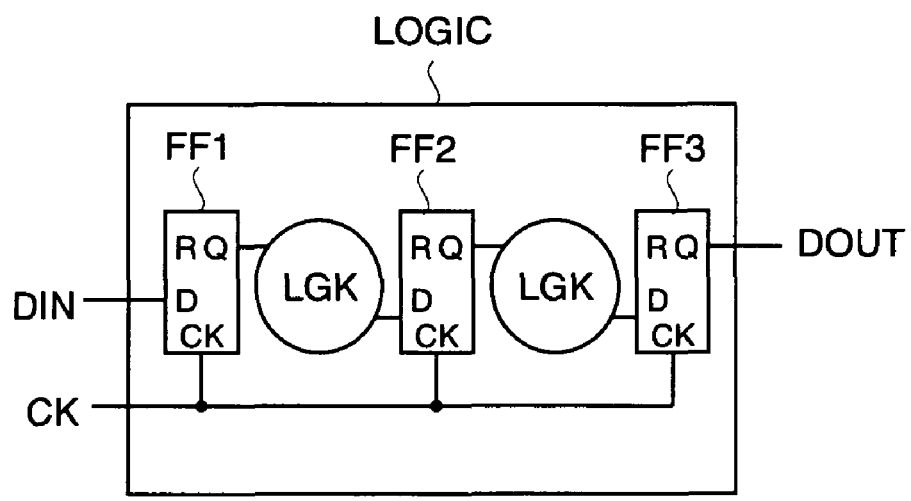
FIGS. 20A and 20B are diagrams for illustrating a timing control scheme for a conventional logic LSI chip and a synchronous DRAM.
Figure 20B:
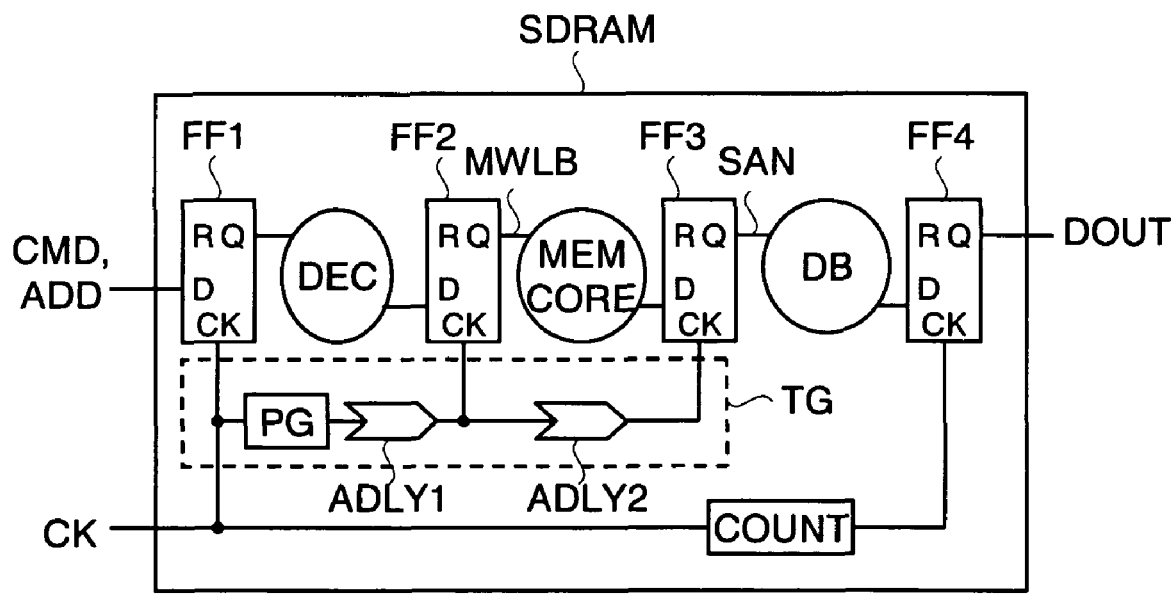

FIG. 19 is a timing chart showing the operation of the analog delay generation circuit DLYA. When fine timing signals FT1 to FT3 are generated by the analog delay generation circuit, the activation signal ACT and the rest signal RST are activated simultaneously (at the timing 0). A logical AND of these signal are delayed (by td61, td62 and td63 respectively) by the analog delay elements ADLY61 to ADLY63 and output as signals TA1 to TA3. The signals TA1 to TA3 are selected respectively by the selector SEL1, SEL2 and SEL3 and the fine timing signals FT1 to FT3 are generated. The fine timing signals FT1 to FT3 are input to the memory block BLK and used for generating a timing signal for a bit line equalization signal BLEQ used in a sense amplifier SA and a row decoder XDEC, a main word line MWLB and a sense amplifier activation signal SAN.

The timing control signal of the present invention is especially useful when applied to a DRAM product; however, the application is not restricted to this; and it is also applicable to an on-chip memory in logic chips such as a microprocessor and a DSP (Digital Signal Processor). According to the present invention, since much time in locking is not required unlike a DLL with a feedback loop, it can be applicable to any timing generator and system.

Each disclosure of the above-mentioned Patent and Non-Patent Documents is incorporated herein by reference thereto. Within the scope of the entire disclosure (including the claims) of the present invention, and based further on the basic technological idea, the preferred mode and the exemplary embodiments can be changed and adjusted. Various combinations of and selections from the various elements disclosed within the scope of the claims of the present invention can be made. Namely, it goes without saying that the present invention includes various variations and modifications that can be made by those skilled in the art according to the entire disclosure and the technical idea including the claims. It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device having a timing control circuit for receiving an activation signal and a clock signal and outputting a timing signal, comprising a digital delay circuit and an analog delay circuit;

said digital delay circuit generating a first signal with a delay time of m*T1 measured from an edge of the clock signal of a period T1 when the activation signal is input where m denotes a non-negative integer; and said analog delay circuit receiving the first signal and outputting a timing signal with a delay time of m*T1+tda measured from the edge of the clock signal, where tda denotes a delay in the analog delay circuit.

2. The semiconductor device according to claim 1, comprising: a first register circuit and a second register circuit that stores m and tda respectively, wherein values of m and tda can be changed by setting the values to the first register circuit and the second register circuit.

3. The semiconductor device according to claim 2, wherein the digital delay circuit comprises a coarse delay circuit that receives a value of m from the first register circuit and outputs a coarse timing signal with a delay of m*T1 measured from the edge of the clock signal when the activation signal is input;

the analog delay circuit comprises a fine delay circuit that receives a preset value of tda from the second register circuit and outputs a fine timing signal with a delay of tda measured from the coarse timing signal; and the fine timing signal is the timing signal.

4. The semiconductor device according to claim 3, wherein the coarse delay circuit comprises: a shift register that shifts the clock signal after the activation signal is input; and a first selection circuit that selects one signal from outputs from each stage of the shift register in response to a value of m and outputting the clock signal as the coarse timing signal when m cycles has passed since the activation signal has been input.

5. The semiconductor device according to claim 3, wherein the fine delay circuit comprises:

one or a plurality of analog delay elements that receive the coarse timing signal; and a second selection circuit that selects and outputs one signal from outputs from the one or a plurality of analog delay elements and the coarse timing signal as the fine timing signal.

6. The semiconductor device according to claim 3, wherein the fine delay circuit comprises:

a plurality of analog delay elements in cascade connection that receives the coarse timing signal at a first stage; and a second selection circuit that selects and outputs one signal from outputs from the plurality of analog delay elements and the coarse timing signal as the fine timing signal.

7. The semiconductor device according to claim 1, wherein a semiconductor memory device includes the timing control circuit and a circuit controlled by the timing signal.

8. The semiconductor device according to claim 7, wherein the timing signal is used for at least one of cancellation of bit line equalization, activation of a word line, activation of a sense amplifier, activation of a column selection line and activation of a main amplifier.

9. The semiconductor device according to claim 7, wherein values stored in the first and the second register circuits can be output in a test mode.

10. The semiconductor device according to claim 7, wherein a value stored in the first and the second register circuits can be set externally in a test mode.

11. The semiconductor device according to claim 7, comprising an analog delay generation circuit that receives and delays the activation signal, wherein an output from the timing control circuit and an output from the analog delay generation circuit can be selected as the timing signal.

12. The semiconductor device according to claim 11, wherein timing of an internal operation of the semiconductor memory device is controlled using an output from the analog delay generation circuit when the device is in a standby mode.

13. A semiconductor device having a timing generation unit comprising:

a first unit that receives a clock signal with a period $T1$, an activation signal and a first selection signal whose value equals m, and outputs a first timing signal with a delay $m*T1$ measured from an effective edge of the clock signal when the activation signal is activated; and a second unit comprising an analog delay circuit that receives the first timing signal, provides with a delay tda, receives a second selection signal whose value equals n, and outputs a second timing signal with delay tda measured from the effective edge of the first timing signal, wherein the delay tda can be varied by a second selection signal.

14. A timing control method of a semiconductor device, comprising:

receiving an activation signal and a clock signal with a period $T1$ and outputting a timing signal with a delay time of $m*T1$ measured from an edge of the clock signal, outputting the timing signal with a delay of $m*T1+tda$ measured from an edge of a clock signal when the activation signal is input where m denotes a non-negative integer and tda denotes a delay in an analog delay circuit.

15. The timing control method according to claim 14, wherein values of m and tda are stored in a first register circuit and a second register circuit and the values can be changed.

16. The timing control method according to claim 15, further comprising:

inputting a value of m and a preset value of tda respectively from the first and the second register circuits;

outputting a coarse timing signal with a delay of $m*T1$ measured from the edge of the clock signal; and outputting a fine timing signal with a delay of tda measured from the coarse timing signal, wherein the fine timing signal is the timing signal.

17. The timing control method according to claim 16, wherein said outputting the coarse timing signal comprises:

shifting the clock signal by a shift register after the activation signal is input; and selecting one signal from outputs from each stage of the shift register in response to a value of m and outputting the clock signal as the coarse timing signal when m cycle(s) has passed since the activation signal has been input.

18. The timing control method according to claim 16, wherein said outputting the fine timing signal comprises:

inputting the coarse timing signal to each of one or a plurality of analog delay elements; and selecting and outputting one signal from outputs from the one or a plurality of analog delay elements and the coarse timing signal as the fine timing signal.

19. The timing control method according to claim 16, wherein said outputting the fine timing signal comprises:
inputting the coarse timing signal to a first stage of a plurality of analog delay elements in cascade connection; and selecting and outputting one signal from outputs from the plurality of analog delay elements and the coarse timing signal as the fine timing signal.

* * * * *